(12) United States Patent
Ashizawa et al.

(10) Patent No.: US 10,864,548 B2
(45) Date of Patent: Dec. 15, 2020

(54) FILM FORMING METHOD AND FILM FORMING APPARATUS

(71) Applicant: Tokyo Electron Limited, Tokyo (JP)

(72) Inventors: Hiroaki Ashizawa, Yamanashi (JP); Yasushi Fujii, Yamanashi (JP); Tsuyoshi Takahashi, Yamanashi (JP); Seokhyoung Hong, Yamanashi (JP); Kazuyoshi Yamazaki, Yamanashi (JP); Hideo Nakamura, Yamanashi (JP); Yu Nunoshige, Yamanashi (JP); Takashi Kamio, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 205 days.

(21) Appl. No.: 15/960,885

(22) Filed: Apr. 24, 2018

(65) Prior Publication Data

US 2018/0311700 A1    Nov. 1, 2018

(30) Foreign Application Priority Data

May 1, 2017 (JP) .................................. 2017-091429
Oct. 18, 2017 (JP) .................................. 2017-201972

(51) Int. Cl.
*B05D 1/34* (2006.01)
*B05D 3/00* (2006.01)
(Continued)

(52) U.S. Cl.
CPC ................. *B05D 1/34* (2013.01); *B05D 1/38* (2013.01); *B05D 3/007* (2013.01); *C23C 16/34* (2013.01);
(Continued)

(58) Field of Classification Search
None
See application file for complete search history.

(56) References Cited

U.S. PATENT DOCUMENTS

2004/0013803 A1* 1/2004 Chung .................... C23C 16/34
427/255.391
2006/0045970 A1* 3/2006 Seo ................... C23C 16/45544
427/248.1

(Continued)

FOREIGN PATENT DOCUMENTS

CN  105938796 A  9/2016
JP  2011-006782 A  1/2011
(Continued)

*Primary Examiner* — Shamim Ahmed
*Assistant Examiner* — Bradford M Gates
(74) *Attorney, Agent, or Firm* — Abelman, Frayne & Schwab

(57) ABSTRACT

A step of constantly supplying first and second carrier gases into a processing container having a substrate therein through first and second carrier gas flow paths, respectively, and supplying a source gas into the processing container through a source gas flow path, a step of purging the source gas by supplying a purge gas into the processing container through a purge gas flow path provided separately from the carrier gas, a step of supplying a reactant gas into the processing container through a reactant gas flow path, and a step of purging the reactant gas by supplying a purge gas into the processing container through the purge gas flow path are performed in a predetermined cycle. An additive gas having a predetermined function is supplied as at least a part of the purge gas in at least one of the purging steps.

13 Claims, 13 Drawing Sheets

(51) Int. Cl.
    *B05D 1/38*     (2006.01)
    *C23C 16/34*     (2006.01)
    *C23C 16/455*     (2006.01)
    *H01L 21/285*     (2006.01)
    *H01L 21/768*     (2006.01)

(52) U.S. Cl.
    CPC .. *C23C 16/45527* (2013.01); *C23C 16/45544* (2013.01); *C23C 16/45561* (2013.01); *H01L 21/28562* (2013.01); *H01L 21/76843* (2013.01)

(56) References Cited

U.S. PATENT DOCUMENTS

2014/0295083 A1* 10/2014 Nasu ................... C23C 16/4408
                                                     427/255.28
2015/0091134 A1* 4/2015 Amaratunga ......... C23C 16/405
                                                        257/532

FOREIGN PATENT DOCUMENTS

| | | |
|---|---|---|
| JP | 2014-198872 A | 10/2014 |
| JP | 2016-023324 A | 2/2016 |
| KR | 10-2002-0084598 A | 11/2002 |
| KR | 10-2007-0112810 A | 11/2007 |

\* cited by examiner

FIG. 1
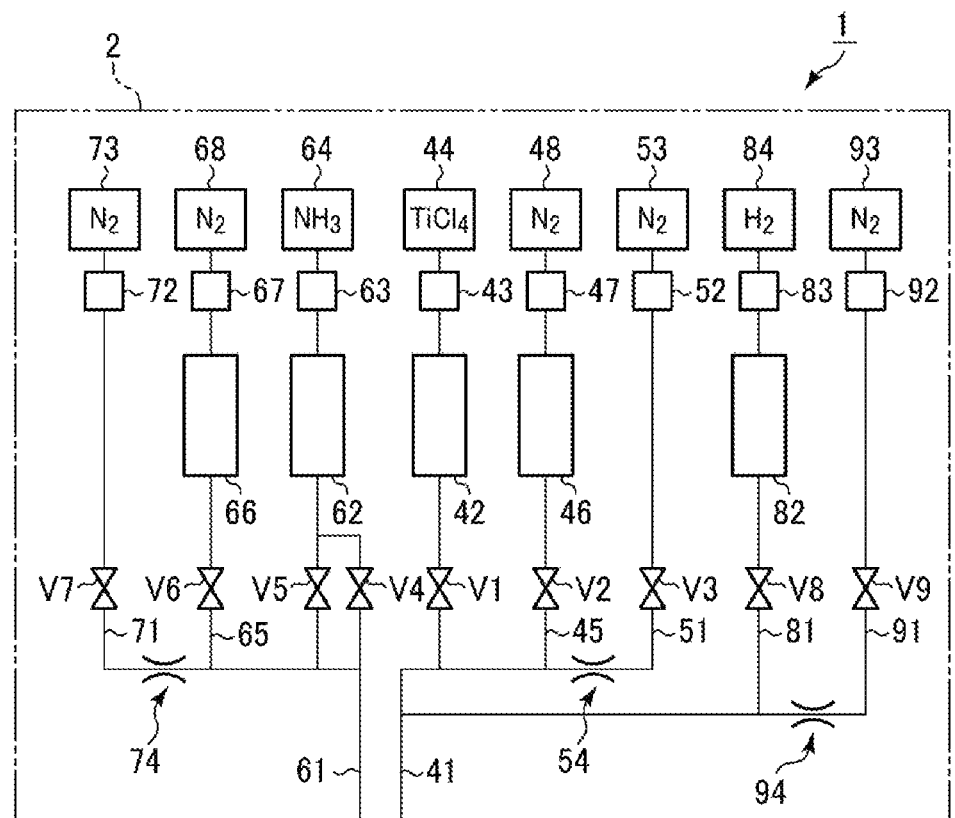
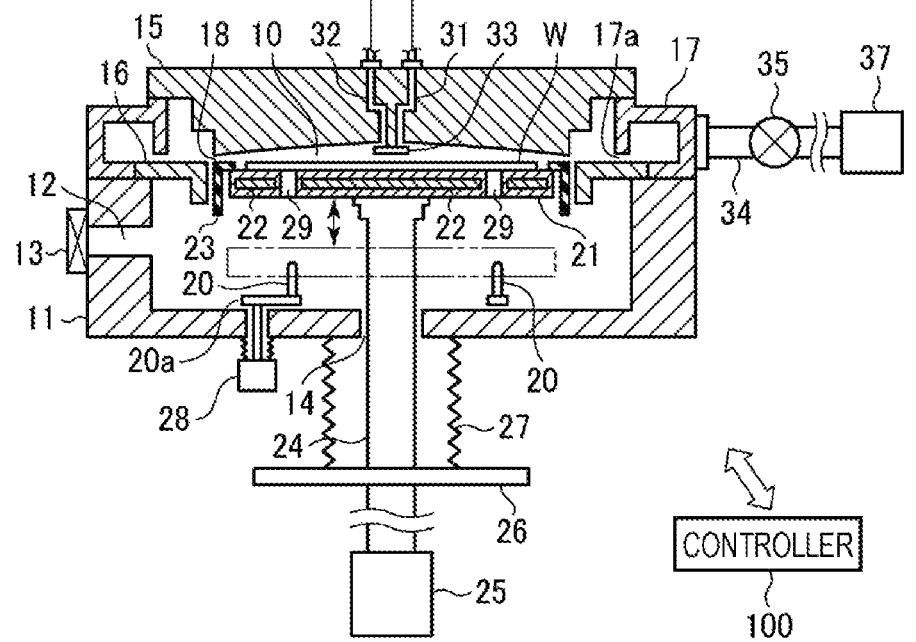

FIG. 6

| SEQUENCE | RECIPE TIME (FILM THICKNESS 10 nm) | THROUGHPUT (WAFERS/h) | SPECIFIC RESISTANCE (μΩ·cm) | THROUGHPUT DETERIORATION (WAFERS/h) |
|---|---|---|---|---|
| SEQUENCE 1 RELATED ART, ALD (NO ADDITION OF H₂) × 230 CYCLES | 291 | 11.7 | 131 | 0 |
| SEQUENCE 2 (NH₃ PURGE / H₂ FLOW) × 230 CYCLES | 291 | 11.7 | 117 | 0 |
| SEQUENCE 3 (NH₃ PURGE / H₂ FLOW) × 230 CYCLES FINAL 15 sec | 306 | 11.2 | 109 | -0.5 |
| SEQUENCE 4 (NH₃ PURGE / H₂ FLOW) × 47 CYCLES FINAL 60 sec | 351 | 9.8 | 104 | -1.9 |
| SEQUENCE 5 ((NH₃ PURGE / H₂ FLOW) × 47 CYCLES FINAL 15 sec) × FIVE TIMES | 370 | 9.3 | 105 | -2.3 |

$$\text{Rough Ratio} = \frac{\text{FILM THICKNESS OF ROUGHNESS LAYER}}{\text{FILM THICKNESS OF ROUGHNESS LAYER} + \text{FILM THICKNESS OF BULK LAYER}}$$

FILM FORMING METHOD AND FILM FORMING APPARATUS

CROSS-REFERENCE TO RELATED APPLICATIONS

This application is based on and claims priority from Japanese Patent Applications Nos. 2017-091429 and 2017-201972, filed on May 1, 2017 and Oct. 18, 2017, respectively, with the Japan Patent Office, the disclosures of which are incorporated herein in their entireties by reference.

TECHNICAL FIELD

The present disclosure relates to a film forming method and a film forming apparatus which form a predetermined film by introducing a predetermined gas into a processing container.

BACKGROUND

In some cases, atomic layer deposition (ALD) may be used when a predetermined film is formed on a semiconductor wafer (hereinafter, referred to as a "wafer") which is a substrate. According to the generally disclosed film forming apparatus performing ALD, the ALD forms a film by depositing an atomic layer of a reaction product on a surface of the wafer by alternately supplying, multiple times, a source gas, which is to be adsorbed to the surface of the wafer, and a reactant gas, which reacts with the source gas, into a processing container in which a vacuum atmosphere is created. In addition, in order to prevent formation of particles by a gas phase reaction between the source gas and the reactant gas in a region in the processing container other than the surface of the wafer, the source gas and the reactant gas are supplied at time intervals, and the interior of the processing container is purged by supplying an inert gas between a period of time for which the source gas is supplied and a period of time for which the reactant gas is supplied such that the atmosphere in the processing container is replaced with the inert gas atmosphere.

SUMMARY

A first aspect of the present disclosure provides a film forming method for forming a predetermined film using a film forming apparatus including: a processing container which accommodates therein a substrate to be processed; a gas supply mechanism which supplies a source gas and a reactant gas for forming the predetermined film on the substrate to be processed, carrier gases for carrying the source gas and the reactant gas to the processing container, respectively, and a purge gas for purging an interior of the processing container; and a gas discharge mechanism which discharges gases in the processing container and maintains a vacuum atmosphere in the processing container. The gas supply mechanism has a source gas flow path which supplies the source gas into the processing container, a reactant gas flow path which supplies the reactant gas into the processing container, a first carrier gas flow path and a second carrier gas flow path which are connected to the source gas flow path and the reactant gas flow path, respectively, and supply the carrier gases for the source gas and the reactant gas, a purge gas flow path which is provided separately from the first carrier gas flow path and the second carrier gas flow path and supplies the purge gas for purging the interior of the processing container into the processing container by controlling a flow rate of the purge gas separately from the first carrier gas and the second carrier gas, an additive gas flow path which supplies an additive gas having a predetermined function to the predetermined film, and opening/closing valves which independently open and close the source gas flow path, the reactant gas flow path, the first and second carrier gas flow paths, the purge gas flow path, and the additive gas flow path, respectively. The film forming method includes: a first process of constantly supplying the carrier gases into the processing container through the first carrier gas flow path and the second carrier gas flow path in a state in which the substrate to be processed is disposed in the processing container; a second process of causing the source gas adsorbed to a surface of the substrate to be processed by supplying the source gas into the processing container through the source gas flow path; a third process of purging the source gas by stopping the supply of the source gas and supplying the purge gas into the processing container through the purge gas flow path; a fourth process of causing the source gas and the reactant gas to react with each other by supplying the reactant gas into the processing container through the reactant gas flow path; and a fifth process of purging the reactant gas by stopping the supply of the reactant gas and supplying the purge gas into the processing container through the purge gas flow path. The second to fifth processes are performed in a predetermined cycle, and the additive gas having the predetermined function is supplied through the additive gas flow path as at least a part of the purge gas in one or both of the third process of purging the source gas and the fifth process of purging the reactant gas.

For example, Japanese Patent Laid-Open Publication No. 2004-263206 discloses a magnetic annealing apparatus which uses a solenoid type magnetic as a means for generating a magnetic field for performing a magnetic annealing processing and requires a relatively small installation area.

BRIEF DESCRIPTION OF THE DRAWINGS

FIG. 1 is a cross-sectional view illustrating an example of an apparatus for performing a film forming method according to an exemplary embodiment of the present disclosure.

FIG. 6 is a view illustrating recipe time, throughput (wafers/h), specific resistance ($\mu\Omega\cdot cm$), and throughput deterioration (wafers/h) in experiments in respect to various sequences according to the first exemplary embodiment.

DESCRIPTION OF EMBODIMENT

Figure 2:
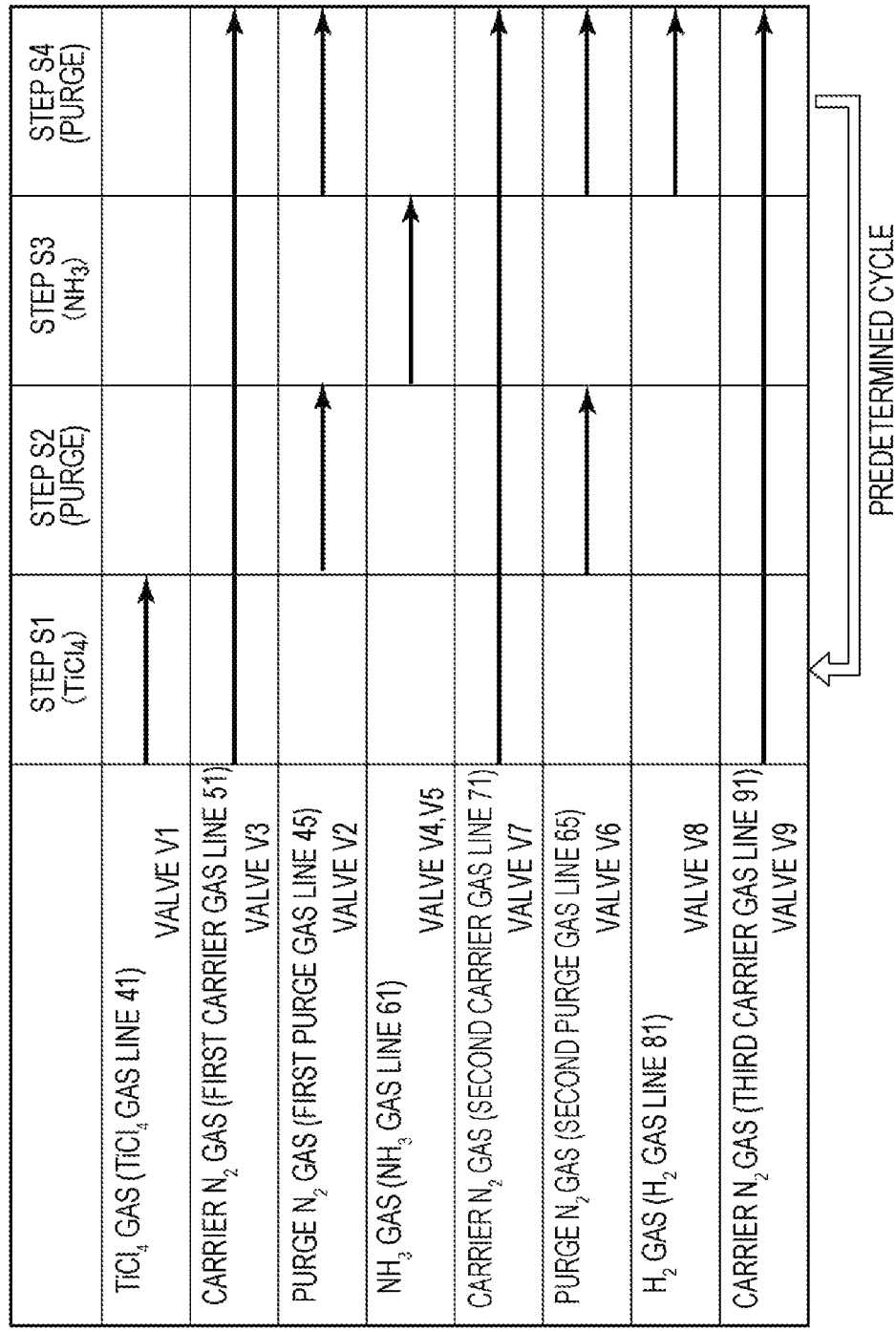
FIG. 2 is a view illustrating an example of a gas supply sequence when performing a film forming method according to a first exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

By the way, as a microfabrication of wiring is realized, a concave portion having a large aspect ratio tends to be formed in a surface of the wafer to be subjected to the ALD, and it is required to perform the ALD in order to ensure good step coverage (coatability) even if the concave portion is formed. To this end, a method of increasing partial pressure of the source gas in the processing container by increasing a flow rate of the source gas is considered.

However, when the flow rate of the source gas is increased as described above, the amount of time required for the film forming process is increased when increasing the amount of time required for performing the purge process in order to prevent formation of particles, and as a result, productivity (throughput) deteriorates.

In a case in which after performing the ALD process, the process using gases having predetermined functions is performed as disclosed in Japanese Patent Laid-Open Publication No. 2011-006782 in forming a predetermined film by the ALD, when it is desired to get an enough effect, the time of the process is prolonged, which also results in productivity (throughput) deterioration.

Therefore, an object of the present disclosure is to provide a technology capable of ensuring high productivity, obtaining a film having high coatability, and supplying an additive gas having a predetermined function during film forming by ALD by alternately supplying a source gas and a reactant gas to a substrate in a processing container.

To achieve the aforementioned object, a first aspect of the present disclosure provides a film forming method for forming a predetermined film using a film forming apparatus including: a processing container which accommodates therein a substrate to be processed; a gas supply mechanism which supplies a source gas and a reactant gas for forming the predetermined film on the substrate to be processed, carrier gases for carrying the source gas and the reactant gas to the processing container, respectively, and a purge gas for purging an interior of the processing container; and a gas discharge mechanism which discharges gases in the processing container and maintains a vacuum atmosphere in the processing container. The gas supply mechanism has a source gas flow path which supplies the source gas into the processing container, a reactant gas flow path which supplies the reactant gas into the processing container, a first carrier gas flow path and a second carrier gas flow path which are connected to the source gas flow path and the reactant gas flow path, respectively, and supply the carrier gases for the source gas and the reactant gas, a purge gas flow path which is provided separately from the first carrier gas flow path and the second carrier gas flow path and supplies the purge gas for purging the interior of the processing container into the processing container by controlling a flow rate of the purge gas separately from the first carrier gas and the second carrier gas, an additive gas flow path which supplies an additive gas having a predetermined function to the predetermined film, and opening/closing valves which independently open and close the source gas flow path, the reactant gas flow path, the first and second carrier gas flow paths, the purge gas flow path, and the additive gas flow path, respectively. The film forming method includes: a first process of constantly supplying the carrier gases into the processing container through the first carrier gas flow path and the second carrier gas flow path in a state in which the substrate to be processed is disposed in the processing container; a second process of causing the source gas adsorbed to a surface of the substrate to be processed by supplying the source gas into the processing container through the source gas flow path; a third process of purging the source gas by stopping the supply of the source gas and supplying the purge gas into the processing container through the purge gas flow path; a fourth process of causing the source gas and the reactant gas to react with each other by supplying the reactant gas into the processing container through the reactant gas flow path; and a fifth process of purging the reactant gas by stopping the supply of the reactant gas and supplying the purge gas into the processing container through the purge gas flow path. The second to fifth processes are performed in a predetermined cycle, and the additive gas having the predetermined function is supplied through the additive gas flow path as at least a part of the purge gas in one or both of the third process of purging the source gas and the fifth process of purging the reactant gas.

In the above-described film forming method, the purge gas flow path has a gas storage unit for storing the purge gas therein, and the purge gas is stored in the gas storage unit and then supplied into the processing container when pressure in the gas storage unit is increased and the valve provided in the purge gas flow path is opened.

In the above-described film forming method, the purge gas flow path includes a first purge gas flow path connected to the source gas flow path and a second purge gas flow path connected to the reactant gas flow path, and supplies the purge gas through the first purge gas flow path and the second purge gas flow path in the third process of purging the source gas and the fifth process of purging the reactant gas.

In the above-described film forming method, the source gas is $TiCl_4$ gas, the reactant gas is $NH_3$ gas, and the predetermined film is a TiN film.

In the above-described film forming method, the additive gas is $H_2$ gas.

In the above-described film forming method, a temperature during film forming is 400 to 750° C., $H_2$ gas is supplied as the additive gas in the fifth process of purging the reactant gas, and the $H_2$ gas serves to decrease specific resistance of the TiN film.

In the above-described film forming method, the second and fifth processes are repeated in multiple cycles, and time of the fifth process for a final cycle is prolonged.

In the above-described film forming method, the second and fifth processes are repeated in multiple cycles, and the fifth process is periodically prolonged.

In the above-described film forming method, a temperature during film forming is 400 to 500° C., $H_2$ gas is supplied as the additive gas in both of the third process of purging the source gas and the fifth process of purging the reactant gas, and the $H_2$ gas serves to improve continuity of the TiN film.

In the above-described film forming method, $H_2$ gas is supplied as the additive gas only in the fifth process of purging the reactant gas or in both of the third process of purging the source gas and the fifth process of purging the reactant gas, and the $H_2$ gas serves to inhibit an etching action of $TiCl_4$.

In the above-described film forming method, a temperature during film forming is within a range of 625 to 740° C.

In the above-described film forming method, a flow rate of the $TiCl_4$ gas is within a range of 50 to 270 sccm.

A second aspect of the present disclosure provides a film forming apparatus including: a processing container which accommodates a substrate to be processed; a gas supply mechanism which supplies a source gas and a reactant gas for forming the predetermined film on the substrate to be processed, carrier gases for carrying the source gas and the reactant gas to the processing container and a purge gas for purging an interior of the processing container, respectively; a gas discharge mechanism which discharges gases in the processing container and maintains a vacuum atmosphere in the processing container; and a controller which controls the gas supply mechanism and the gas discharge mechanism. The gas supply mechanism has a source gas flow path which supplies the source gas into the processing container, a reactant gas flow path which supplies the reactant gas into the processing container, a first carrier gas flow path and a second carrier gas flow path which are connected to the source gas flow path and the reactant gas flow path, respectively, and supply the carrier gases for the source gas and the reactant gas, a purge gas flow path which is provided separately from the first carrier gas flow path and the second carrier gas flow path and supplies the purge gas for purging the interior of the processing container into the processing container by controlling a flow rate of the purge gas separately from the first carrier gas and the second carrier gas, an additive gas flow path which supplies an additive gas having a predetermined function to the predetermined film, and opening/closing valves which independently open and close the source gas flow path, the reactant gas flow path, the first and second carrier gas flow paths, the purge gas flow path, and the additive gas flow path, respectively. The controller performs a film forming method in a state where the substrate to be processed is disposed within the processing container. The film forming method includes a first process of constantly supplying the carrier gases into the processing container through the first carrier gas flow path and the second carrier gas flow path in a state in which the substrate to be processed is disposed in the processing container, a second process of causing the source gas to be adsorbed to a surface of the substrate to be processed by supplying the source gas into the processing container through the source gas flow path, a third process of purging the source gas by stopping the supply of the source gas and supplying the purge gas into the processing container through the purge gas flow path, a fourth process of causing the source gas and the reactant gas to react with each other by supplying the reactant gas into the processing container through the reactant gas flow path, and a fifth process of purging the reactant gas by stopping the supply of the reactant gas and supplying the purge gas into the processing container through the purge gas flow path. The controller performs the second to fifth processes in a predetermined cycle, and performs control such that the additive gas having the predetermined function is supplied through the additive gas flow path as at least a part of the purge gas in one or both of the third process of purging the source gas and the fifth process of purging the reactant gas.

According to the present disclosure, in forming a film by alternately supplying the source gas and the reactant gas onto a substrate in the processing container, the purge gas is supplied through the flow path which is separate from that of the carrier gas which is supplied constantly, while separately controlling the flow rate of the purge gas is separately controlled, and the additive gas having a predetermined function is supplied during the purge process. As a result, it is possible to ensure high productivity, obtain a film having high coatability, and supply the additive gas having a predetermined function.

Hereinafter, exemplary embodiments of the present disclosure will be specifically described with reference to the accompanying drawings.

Here, an example in which $TiCl_4$ gas is used as a film forming source gas (precursor gas), $NH_3$ gas is used as a reactant gas, $H_2$ gas is used as a reformed gas, and a TiN film is formed by ALD will be described.

<Film Forming Apparatus>

FIG. 1 is a cross-sectional view illustrating an example of an apparatus for performing a film forming method according to an exemplary embodiment of the present disclosure. A film forming apparatus 1 has a processing container 11 which has a flat circular shape and accommodates a wafer W which is a substrate to be processed. A concave portion, which is configured to form wiring, is formed in a surface of the wafer W.

The film forming apparatus 1 has a gas supply mechanism 2 which supplies the wafer W in the processing container 11 with $TiCl_4$ (titanium tetrachloride) gas used as a source gas (precursor gas), $NH_3$ (ammonia) gas used as a reactant gas, $N_2$ gas used as a carrier gas and a purge gas, and $H_2$ gas used as a reforming gas.

A loading-unloading port 12 for the wafer W is formed in a sidewall of the processing container 11, and the loading-unloading port 12 is opened and closed by a gate valve 13. In addition, a placement table 21 for placing the wafer W in a horizontal state is provided in the processing container 11. A heater 22 for heating the wafer W to a predetermined temperature is embedded in the placement table 21. In addition, a cylindrical cover member 23, which surrounds the placement table 21, is provided at a circumference of the placement table 21.

The placement table 21 is supported by a strut 24. The strut 24 extends toward a lower side of the processing container 11 from a center of a bottom surface of the placement table 21 while penetrating a hole portion formed in a bottom wall of the processing container 11, and a lower end of the strut 24 is connected to a lift mechanism 25. The lift mechanism 25 moves the placement table 21 upward and downward between a processing position at an upper side of the processing container 11 as indicated by a solid line in the drawing and a delivery position at a lower side of the processing container 11 as indicated by an alternate long and two short dashes line in the drawing.

A flange 26 is mounted on the strut 24 at a position below the processing container 11, and a bellows 27, which partitions an atmosphere in the processing container 11 from outside air and is extended/contracted by the upward and downward movements of the placement table, is provided between the bottom surface of the processing container 11 and the flange 26.

Three wafer lift pins 20 (only the two wafer lift pins 20 are illustrated) are provided in the vicinity of the bottom surface of the processing container 11 so as to protrude upward from a lift plate 20a. The wafer lift pin 20 is configured to be movable upward and downward via the lift plate 20a by a lift mechanism 28 provided below the processing container 11. The wafer lift pins 20 are configured to be projectable/sinkable with respect to an upper surface of the placement table 21 while being inserted into through holes 29 provided in the placement table 21 positioned at the delivery position. As the wafer lift pin 20 is moved upward and downward as described above, the wafer W is delivered between a wafer transport mechanism (not illustrated) and the placement table 21.

A ceiling surface of the processing container 11 is defined by a top plate 15. The ceiling surface is formed downward from a central portion toward a circumferential edge portion, and when the placement table 21 is positioned at the processing position, a flat conical processing space 10 is formed to be surrounded by a surface of the placement table 21, a surface of the cover member 23, and the ceiling surface of the processing container 11. Two gas supply paths 31 and 32 are formed at a central portion of the top plate 15 so as to penetrate the top plate 15 in a thickness direction, and a dispersion plate 33, which disperses gas discharged from the gas supply paths 31 and 32 into the processing space 10, is, for example, horizontally provided below the gas supply paths 31 and 32.

A gas discharge duct 17, which has an annular shape so as to surround a side surface of the processing space 10, is provided at the upper side of the processing container 11. A slit 17a is formed in the gas discharge duct 17 along an inner circumferential surface of the gas discharge duct 17. In addition, an annular member 16 is formed between a lower portion of the gas discharge duct 17 and the cover member 23. An inner circumferential portion of the annular member 16 is close to the cover member 23, and an outer circumferential portion of the annular member 16 is in close contact with the lower portion of the gas discharge duct 17. A gap 18 is formed between the cover member 23 and the top plate 15 of the processing container 11. One end of a gas discharge tube 34 is connected to an outer wall of the gas discharge duct 17, and the other end of the gas discharge tube 34 is connected to a vacuum pump 37 through a pressure control valve 35 which adjusts vacuum pressure in the processing space 10 by adjusting a gas discharge amount. As the vacuum pump 37 operates, the gas in the processing space 10 reaches a gas discharge space in the gas discharge duct 17 via the gap 18 and the slit 17a, and then the gas is discharged through the gas discharge tube 34.

The gas supply mechanism 2 has a $TiCl_4$ gas line 41 and an $NH_3$ gas line 61 each having one end connected to the gas supply paths 31 and 32. $TiCl_4$ gas, which is the source gas, is supplied to the $TiCl_4$ gas line 41, and $NH_3$ gas, which is the reactant gas, is supplied to the $NH_3$ gas line 61.

A valve V1, a gas storage tank 42, and a flow rate adjusting unit 43 are provided, in this order from the lower side, in the $TiCl_4$ gas line 41, and a $TiCl_4$ gas supply source 44, which supplies the $TiCl_4$ gas, that is, the processing gas, is connected to the other end of the $TiCl_4$ gas line 41. The $TiCl_4$ gas supply source 44 has a tank for storing liquid-phase $TiCl_4$ and vaporizes $TiCl_4$ in the tank by heating the tank, and the vaporized $TiCl_4$ is supplied from the $TiCl_4$ gas supply source 44 to the $TiCl_4$ gas line 41.

One end of a first purge gas line 45 is connected to the $TiCl_4$ gas line 41 at a downstream side of the valve V1. A valve V2, a gas storage tank 46, and a flow rate adjusting unit 47 are provided, in this order from the lower side, in the first purge gas line 45, and a first purge gas supply source 48, which supplies $N_2$ gas for purging, is connected to the other end of the first purge gas line 45.

One end of a first carrier gas line 51, which supplies $N_2$ gas as a carrier gas for $TiCl_4$ gas, is connected to the first purge gas line 45 at a downstream side of the valve V2. A valve V3 and a flow rate adjusting unit 52 are provided, in this order from the lower side, in the first carrier gas line 51, and a first carrier gas supply source 53, which is a supply source for $N_2$ gas as a carrier gas for $TiCl_4$ gas, is connected to the other end of the first carrier gas line 51. An orifice 54 is formed in the first carrier gas line 51 at a downstream side of the valve V3. Since a diameter of the first carrier gas line 51 at the downstream side of the valve V3 is smaller than a diameter of the first carrier gas line 51 at an upstream side of the valve V3 and diameters of the gas lines 41 and 45, the gas is supplied at a comparatively high flow rate to the gas lines 41 and 45 by the gas storage tanks 42 and 46, but the gas supplied to the gas lines 41 and 45 is inhibited by the orifice 54 from flowing reversely in the gas line 51.

The carrier gas from the first carrier gas supply source 53 is continuously supplied into the processing container 11 while the wafer W is processed, and the carrier gas serves as a purge gas while performing the purge process. Further, the carrier gas also serves as a reverse flow prevention gas for preventing the $TiCl_4$ gas from flowing reversely in the first carrier gas line 51.

Two lines branch off from the NH$_3$ gas line 61 at the upstream side, and the branch lines are merged. A gas storage tank 62 and a flow rate adjusting unit 63 are provided, in this order from the lower side, in the merged NH$_3$ gas line 61, an NH$_3$ gas supply source 64 is connected to an end of the merged NH$_3$ gas line 61, and the NH$_3$ gas is supplied into the processing container 11 from the NH$_3$ gas supply source 64. Valves V4 and V5 are provided in the two branch lines, respectively. Since the branch flow paths are formed at the downstream side of the gas storage tank 62, conductance is increased such that the NH$_3$ gas may be supplied at a high flow rate to the processing container 11.

One end of a second purge gas line 65 is connected to a portion, which branches off from the NH$_3$ gas line 61, at a downstream side of a valve V5. A valve V6, a gas storage tank 66, and a flow rate adjusting unit 67 are provided, in this order from the lower side, in the second purge gas line 65, and a second purge gas supply source 68, which supplies the N$_2$ gas for purging, is connected to the other end of the second purge gas line 65.

One end of a second carrier gas line 71, which supplies N$_2$ gas as a carrier gas for NH$_3$ gas, is connected to the second purge gas line 65 at a downstream side of the valve V6. A valve V7 and a flow rate adjusting unit 72 are provided, in this order from the lower side, in the second carrier gas line 71, and a second carrier gas supply source 73, which is a supply source for N$_2$ gas as a carrier gas for NH$_3$ gas, is connected to the other end of the second carrier gas line 71. An orifice 74 is formed in the second carrier gas line 71 at a downstream side of the valve V7. Since a diameter of the second carrier gas line 71 at the downstream side of the valve V7 is smaller than a diameter of the second carrier gas line 71 at an upstream side of the valve V7 and diameters of the gas lines 61 and 65, the gas is supplied at a comparatively high flow rate to the gas lines 61 and 65 by the gas storage tanks 62 and 66, but the gas supplied to the gas lines 61 and 65 is inhibited by the orifice 74 from flowing reversely in the gas line 71.

The carrier gas from the second carrier gas supply source 73 is continuously supplied into the processing container 11 while the wafer W is processed, and the carrier gas serves as a purge gas while performing the purge process. Further, the carrier gas also serves as a reverse flow prevention gas for preventing the NH$_3$ gas from flowing reversely in the second carrier gas line 71.

One end of an H$_2$ gas line 81, which supplies H$_2$ gas as an additive gas having a predetermined function, is connected to the TiCl$_4$ gas line 41 at a downstream side from a connecting portion of the first purge gas line 45. A valve V8, a gas storage tank 82, and a flow rate adjusting unit 83 are provided, in this order from the lower side, in the H$_2$ gas line 81, and an H$_2$ gas supply source 84, which supplies H$_2$ gas, is connected to the other end of the H$_2$ gas line 81.

One end of a third carrier gas line 91, which supplies N$_2$ gas as a carrier gas for H$_2$ gas, is connected to the H$_2$ gas line 81 at a downstream side of the valve V8. A valve V9 and a flow rate adjusting unit 92 are provided, in this order from the lower side, in the third carrier gas line 91, and a third carrier gas supply source 93, which is a supply source for N$_2$ gas as a carrier gas for H$_2$ gas, is connected to the other end of the third carrier gas line 91. A reverse flow prevention orifice 94 is formed in the third carrier gas line 91 at a downstream side of the valve V9. Further, the carrier gas also serves as a reverse flow prevention gas for preventing the H$_2$ gas from flowing reversely in the third carrier gas line 91.

The H$_2$ gas line and the H$_2$ gas supply source, together with the carrier gas line and the carrier gas supply source, may be connected to the NH$_3$ gas line 61, or may be connected to both of the TiCl$_4$ gas line 41 and the NH$_3$ gas line 61.

The flow rate adjusting units 43, 47, 52, 63, 67, 72, 83, and 92 are configured as mass flow controllers and adjust and control flow rates of the gases flowing through the gas lines that correspond to the flow rate adjusting units 43, 47, 52, 63, 67, 72, 83, and 92, respectively. Further, appropriate components are used as the respective flow rate adjusting units in accordance with temperatures of the gases in order to adjust the flow rates of the gases. A component, which is designed to adjust the flow rate of the TiCl$_4$ gas heated to a high temperature, is used as the flow rate adjusting unit 43 for TiCl$_4$ gas.

The gas storage tanks 42, 46, 62, 66, and 82 store the gases, which are supplied from the gas supply sources connected to the corresponding gas lines, before the gases are supplied into the processing container 11, and the gases are supplied into the processing container 11 from the respective gas storage tanks after the pressure in the processing container 11 is increased to a predetermined pressure by storing the gases. Therefore, it is possible to stably supply the gases into the processing container at a high flow rate. The operations of allowing or cutting off the supply of the gases into the processing container 11 from the gas storage tanks 42, 46, 62, 66, and 82 are performed by the corresponding valves.

As described above, in the gas supply mechanism 2, the first carrier gas line 51 is provided with the valve V3 and the flow rate adjusting unit 52 as a mechanism for supplying and controlling the carrier gas, and the valve V2 and the flow rate adjusting unit 47, as a mechanism for supplying and controlling the purge gas, are provided in the first purge gas line 45 separately from the valve V3 and the flow rate adjusting unit 52. In addition, the second carrier gas line 71 is provided with the valve V7 and the flow rate adjusting unit 72 as a mechanism for supplying and controlling the carrier gas, and the valve V6 and the flow rate adjusting unit 67, as a mechanism for supplying and controlling the purge gas, are provided in the second purge gas line 65 separately from the valve V7 and the flow rate adjusting unit 72.

The purge gas is supplied into the processing container 11 via the TiCl$_4$ gas line 41 and the NH$_3$ gas line 61 from the first purge gas line 45 and the second purge gas line 65, thereby purging not only the TiCl$_4$ gas and the NH$_3$ gas remaining in the processing container 11, but also the TiCl$_4$ gas remaining at the downstream side of the valve V1 and the NH$_3$ gas remaining at the downstream sides of the valves V4 and V5 in the TiCl$_4$ gas line 41 and the NH$_3$ gas line 61.

The film forming apparatus 1 is provided with a controller 100. The controller 100 is configured by a computer and has a main controller provided with a CPU, an input device (a keyboard, a mouse, etc.), an output device (a printer, etc.), a display device (a display, etc.), and a storage device (a storage medium). For example, the main controller controls the operations of the respective components, such as operations of opening and closing the valves V1 to V9, operations of adjusting the gas flow rates by the flow rate adjusting units 43, 47, 52, 63, 67, 72, 83, and 92, an operation of adjusting the pressure in the processing container 11 by the pressure control valve 35, and an operation of adjusting the temperature of the wafer W by the heater 22. The operations are controlled by a processing recipe which is a control program stored in the storage medium (a hard disk, an optical disk, a semiconductor memory, etc.) embedded in the storage device.

First Exemplary Embodiment of Film Forming Method

Next, a first exemplary embodiment of a film forming method of the film forming apparatus 1 configured as described above will be described. The following processing operations are performed based on the processing recipe stored in the storage medium of the controller 100.

The film forming method according to the present exemplary embodiment forms a TiN film, which has low specific resistance at a comparative high temperature, on the surface of the wafer W which is formed with an insulating film having a fine concave portion. The TiN film is required to have low specific resistance. In the related art, a TiN film formed at a high temperature of about 700° C. by ALD has a film thickness of 10 nm and specific resistance of 130 $\mu\Omega$·cm, but the TiN film is required to have lower specific resistance. The present exemplary embodiment forms a TiN film capable of having lower specific resistance.

First, in a state in which the valves V1 to V9 are closed and the placement table 21 is moved downward to the delivery position, the gate valve 13 is opened, the wafer W is loaded into the processing container 11 through the loading-unloading port 12 from a vacuum transport chamber (not illustrated) by a transport device (not illustrated), the wafer W is placed on the lift pins 20, the transport device is retracted, and then the gate valve 13 is closed. Further, the placement table 21 is moved upward to the processing position such that the wafer W is placed on the placement table 21. The placement table 21 is heated by the heater 22 to a temperature ranging from 400 to 750° C. Further, the valves V3, V7, and V9 are opened to supply the carrier $N_2$ gas into the processing container 11 through the first to third carrier gas lines 51, 71, and 91 from the first to third carrier gas supply sources 53, 73, and 93, the processing container 11 is maintained in a predetermined depressurized state, and the temperature of the wafer W is controlled to a range of 400 to 750° C., for example, a temperature of 700° C. (actually, the temperature of the placement table 21 is higher by about 10° C. than the temperature of the wafer W). In this case, the valves V1, V2, V4, V5, V6, and V8 remain closed. Meanwhile, the $TiCl_4$ gas and the $NH_3$ gas are supplied to the $TiCl_4$ gas line 41 and the $NH_3$ gas line 61 from the $TiCl_4$ gas supply source 44 and the $NH_3$ gas supply source 64, respectively, but because the valves V1, V4, and V5 are closed, the $TiCl_4$ gas and the $NH_3$ gas are stored in the storage tanks 42 and 62 such that the pressure in the gas storage tanks 42 and 62 is increased.

In this state, the process of forming the TiN film by the ALD is initiated. FIG. 2 is a view illustrating an example of a gas supply sequence while forming the TiN film by the ALD, and FIG. 3 is a timing chart schematically illustrating a change in amount of gas to be supplied when forming the TiN film by the ALD.

Figure 3:
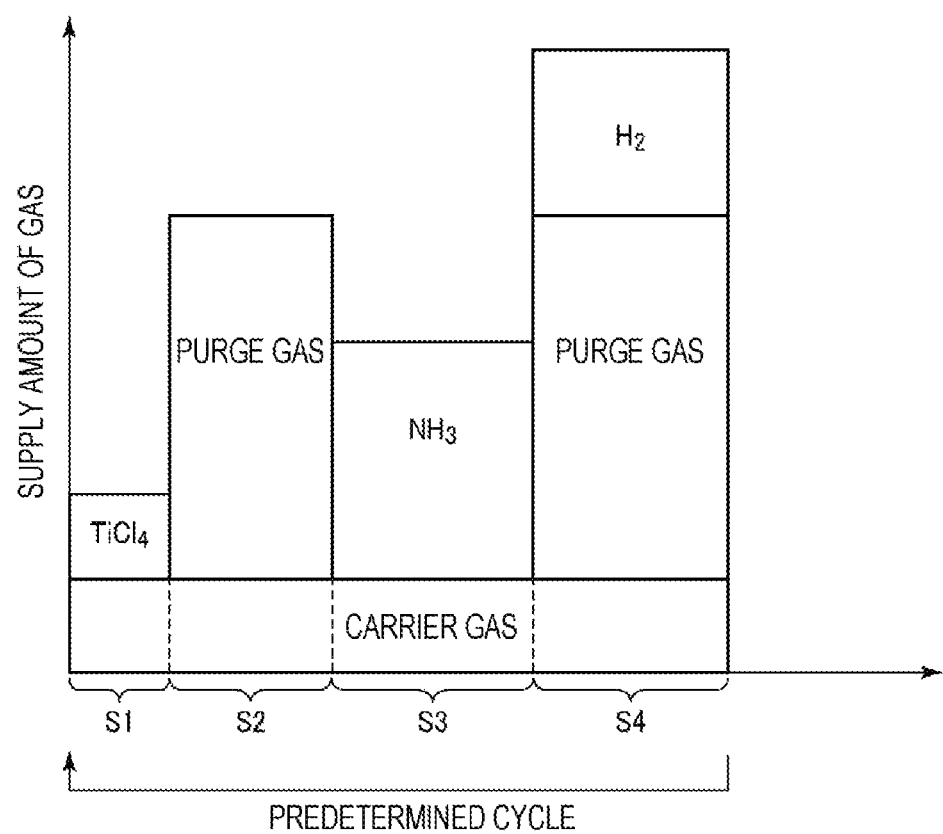
FIG. 3 is a timing chart schematically illustrating a change in amount of gas supplied when performing the film forming method according to the first exemplary embodiment of the present disclosure.

As illustrated in FIGS. 2 and 3, when forming the TiN film by the ALD, initially, in a state in which the valves V3, V7, and V9 are opened and the carrier $N_2$ gas is continuously supplied through the first to third carrier gas lines 51, 71, and 91 from the first to third carrier gas supply sources 53, 73, and 93, the valve V1 is opened such that the $TiCl_4$ gas stored in the gas storage tank 42 is supplied into the processing container 11 (processing space 10) and adsorbed to the surface of the wafer W (step S1).

In this case, the flow rate of the $N_2$ gas, which is the carrier gas supplied through the first to third carrier gas lines 51, 71, and 91, may be 200 to 10,000 sccm, respectively, that is, 600 to 30,000 sccm in total, for example, 333 sccm for each gas, that is, 1,000 sccm in total. In addition, the pressure in the processing container 11 (processing space 10) may be 1 to 9 Torr (113.3 to 1,199.7 Pa), for example, 5 Torr (666.5 Pa).

The flow rate of the $TiCl_4$ gas may be 50 to 300 sccm, for example, 150 sccm. The time in step S1 may be within a range of 0.03 to 30 sec, for example, 0.1 sec.

In parallel with step S1, the purge gas is supplied to the first purge gas line 45 and the second purge gas supply line 65 from the first purge gas supply source 48 and the second purge gas supply source 68. However, because the valves V2 and V6 are closed, the purge gas is stored in the gas storage tanks 46 and 66, and as a result, the pressure in the gas storage tanks 46 and 66 is increased.

Next, in a state in which the valves V3, V7, and V9 are opened and the carrier $N_2$ gas is continuously supplied at the same flow rate through the first to third carrier gas lines 51, 71, and 91 from the first to third carrier gas supply sources 53, 73, and 93, the valve V1 is closed to stop the supply of the $TiCl_4$ gas, the valves V2 and V6 are opened to supply the purge gas stored in the gas storage tanks 46 and 66 into the processing container 11 (processing space 10), and the purge gas is discharged through the gas discharge tube 34 by the vacuum pump 37 such that the interior of the processing container 11 (processing space 10) is purged (step S2).

As described above, the purge gas is supplied from the gas storage tanks 46 and 66 with increased pressure through lines separately from the carrier gas such that the $N_2$ gas as the purge gas is supplied at a high flow rate, for example, a flow rate higher than a flow rate of the carrier gas into the processing container 11 (processing space 10), and as a result, it is possible to purge the $TiCl_4$ gas in the processing container 11 in a short time.

In this case, the flow rate of the purge gas, which is supplied through the first and second purge gas lines 45 and 65, may be 200 to 10,000 sccm, respectively, that is, 400 to 20,000 sccm in total, for example, 9,000 sccm for each gas, that is, 18,000 sccm in total. The time in step S2 may be in a range of 0.03 to 30 sec, for example, 0.2 sec.

In parallel with step S2, the $TiCl_4$ gas is supplied to the $TiCl_4$ gas line 41 from the $TiCl_4$ gas supply source 44. However, because the valve V1 is closed, the $TiCl_4$ gas is stored in the gas storage tank 42, and as a result, the pressure in the gas storage tank 42 is increased.

Next, in a state in which the valves V3, V7, and V9 are opened and the carrier $N_2$ gas is continuously supplied at the same flow rate through the first to third carrier gas lines 51, 71, and 91 from the first to third carrier gas supply sources 53, 73, and 93, the valves V2 and V6 are closed to stop the supply of the purge gas, and the valves V4 and V5 are opened to supply the $NH_3$ gas stored in the gas storage tank 62 into the processing container 11 (processing space 10) such that the purge gas reacts with the $TiCl_4$ gas on the surface of the wafer W (step S3). In this way, a molecular layer of TiN is formed.

In this case, the flow rate of the $NH_3$ gas may be 200 to 10,000 sccm, for example, 3,800 sccm. The time in step S3 may be in a range of 0.03 to 30 sec, for example, 0.25 sec.

In parallel with step S3, the purge gas is supplied to the first purge gas line 45 and the second purge gas supply line 65 from the first purge gas supply source 48 and the second purge gas supply source 68, and the $H_2$ gas is supplied to the $H_2$ gas line 81 from the $H_2$ gas supply source 84. However, because the valves V2, V6, and V8 are closed, the purge gas is stored in the gas storage tanks 46 and 66, and the $H_2$ gas is stored in the gas storage tank 82, and as a result, the pressure in the gas storage tanks 46, 66, and 82 is increased.

Next, in a state in which the valves V3, V7, and V9 are opened and the carrier $N_2$ gas is continuously supplied at the same flow rate through the first to third carrier gas lines 51, 71, and 91 from the first to third carrier gas supply sources 53, 73, and 93, the valves V4 and V5 are closed to stop the supply of the $NH_3$ gas, the valves V2, V6, and V8 are opened to supply the purge gas stored in the gas storage tanks 46 and 66 and the $H_2$ gas stored in the gas storage tank 82 into the processing container 11 (processing space 10), and the gases are discharged through the gas discharge tube 34 by the vacuum pump 37 such that the interior of the processing container 11 (processing space 10) is purged (step S4).

Similar to step S2, the purge gas is supplied from the gas storage tanks 46 and 66 with increased pressure through lines separately from the carrier gas such that the $N_2$ gas as the purge gas is supplied at a high flow rate, for example, a flow rate higher than a flow rate of the carrier gas into the processing container 11 (processing space 10), and as a result, it is possible to purge the $NH_3$ gas in the processing container 11 in a short time. In addition, the molecular layer of TiN is reformed by the $H_2$ gas by supplying the $H_2$ gas during the purge process. In addition, since the processing is performed by the $H_2$ gas during the purge process, it is possible to perform the reforming process without degrading throughput. In addition, since the $H_2$ gas may be supplied at any flow rate, it is possible to perform the reforming process by $H_2$ through the purge process in a short time by supplying the $H_2$ gas at a high flow rate.

In this case, the flow rate of the purge gas, which is supplied through the first and second purge gas lines 45 and 65, may be 200 to 10,000 sccm, respectively, that is, 400 to 20,000 sccm in total, for example, 9,000 sccm for each gas, that is, 18,000 sccm in total. In addition, the flow rate of the $H_2$ gas supplied through the $H_2$ gas line 81 may be 200 to 10,000 sccm, for example, 7,000 sccm. The time in step S4 may be within a range of 0.03 to 30 sec, for example, 0.3 sec.

In parallel with step S4, the $NH_3$ gas is supplied to the $NH_3$ gas line 61 from the $NH_3$ gas supply source 64. However, because the valves V4 and V5 are closed, the $NH_3$ gas is stored in the gas storage tank 62, and as a result, the pressure in the gas storage tank 62 is increased.

The aforementioned steps S1 to S4 are performed for one or more predetermined cycles, and as a result, it is possible to obtain the reformed TiN film having a predetermined film thickness. That is, in the present exemplary embodiment, in the purge process (step S4) after the molecular layer of TiN is formed, annealing is performed in the $H_2$ gas atmosphere such that a size of a TiN crystal grain is increased, and as a result, it is possible to increase a size of the crystal grain of the TiN film by performing steps S1 to S4 for predetermined cycles. For this reason, it is possible to obtain the TiN film with low specific resistance.

In this way, after the TiN film having a predetermined film thickness is formed, the interior of the processing container 11 is purged by the purge gas, the placement table 21 is moved downward to the delivery position, the gate valve 13 is opened, and then the wafer W after the processing is unloaded to the vacuum transport chamber (not illustrated) through the loading-unloading port 12 by the transport device (not illustrated).

Figure 4:
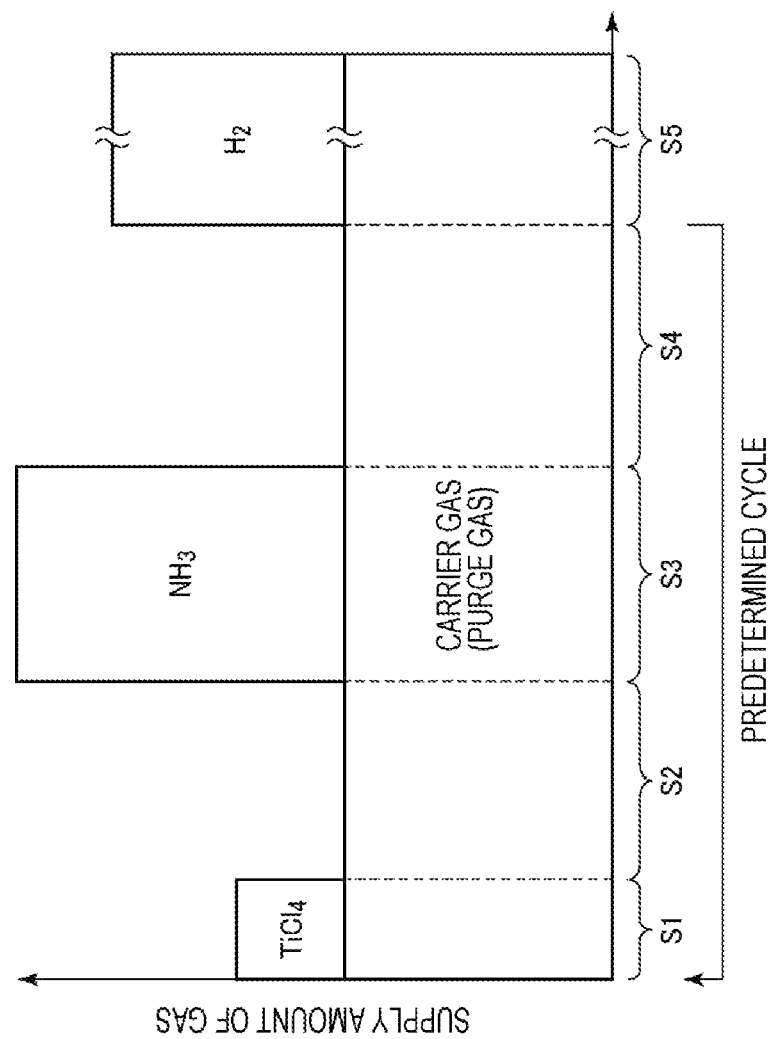
FIG. 4 is a view illustrating an example of a gas supply sequence when performing a film forming method in the related art.

In the related art, as illustrated in FIG. 4, the carrier gases for the $TiCl_4$ gas and the $NH_3$ gas are continuously supplied, and the carrier gas are used as the purge gases, but the supply amount of carrier gas is increased because the carrier gas needs to be supplied into the processing container in the amount required for the purge process. Meanwhile, it is necessary to increase partial pressure of the source gas in the processing container by increasing the supply amount of $TiCl_4$ gas, which is the source gas, in order to ensure good step coverage (coatability), but because the flow rate of the carrier gas supplied as the purge gas is increased, the supply amount of $TiCl_4$ gas needs to be excessively increased to increase the partial pressure of the $TiCl_4$ gas, and as a result, the purge time is increased such that throughput, that is, productivity deteriorates. In addition, the amount of $TiCl_4$ gas attached to the processing container or pipes is increased in a case in which the supply amount of $TiCl_4$ gas is increased, and as a result, maintenance frequency is increased. Further, the processing by the $H_2$ gas is performed separately from the ALD process as disclosed in Japanese Patent Laid-Open Publication No. 2011-006782, and as a result, productivity (throughput) further deteriorates to that extent.

In contrast, in the present exemplary embodiment, the first and second purge gas lines 45 and 65 are provided separately from the first and second carrier gas lines 51 and 71 in order to supply the carrier gases for the $TiCl_4$ gas and the $NH_3$ gas, and the valves V2 and V6 and the flow rate adjusting units 47 and 67 are provided in the first and second purge gas lines 45 and 65 separately from the valves V3 and V7 and the flow rate adjusting units 52 and 72 in the first and second carrier gas lines 51 and 71, and as a result, it is possible to increase the flow rate of the purge gas only during the purge process such that the flow rate of the carrier gas need not be increased. For this reason, coatability (step coverage) may be increased without greatly increasing the flow rate of the $TiCl_4$ gas which is the source gas, and as a result, it is possible to obtain good coatability (step coverage) of 90% or more without degrading productivity. In addition, the processing by the $H_2$ gas, which is performed to decrease specific resistance, is performed during the purge process after the $NH_3$ gas is supplied, and as a result, the ALD is not affected, and deterioration in productivity (throughput) caused by the processing by the $H_2$ gas hardly occurs. In addition, the purge gas and the $H_2$ gas may be supplied during the purge process in a state in which the amount of carrier gas is small, and as a result, it is possible to perform the reforming process by $H_2$ through the purge process in a short time by supplying the $H_2$ gas at a high flow rate.

The purge gas is supplied from the gas storage tanks 46 and 66 with increased pressure such that the purge gas is supplied at a high flow rate, for example, a flow rate higher than a flow rate of the carrier gas into the processing container 11 (processing space 10), and as a result, it is possible to purge the $TiCl_4$ gas or the $NH_3$ gas in the processing container 11 in a short time. For this reason, it is possible to further increase throughput.

In the present exemplary embodiment, steps S1 to S4 may be performed in multiple cycles, and the time in step S4 for a final cycle may be prolonged. In this case, the time may be 60 sec or less. Therefore, even if throughput slightly deteriorates, it is possible to further decrease specific resistance because the effect of the processing by the $H_2$ gas may be further increased.

The time in step S4 may be prolonged periodically when performing steps S1 to S4 multiple times. In this case, even if throughput further deteriorates, it is possible to further decrease specific resistance because the effect of the processing by the $H_2$ gas may be further increased.

Both of the purge gas and the $H_2$ gas are used in step S4, but because the $H_2$ gas also serves as the purge gas, a ratio between the purge gas and the $H_2$ gas may be arbitrarily determined, and only the $H_2$ gas may be used.

In the present exemplary embodiment, the $H_2$ gas may be supplied even in step S2 which is the purge process after the $TiCl_4$ gas is supplied.

Next, an experimental result of the present exemplary embodiment will be described.

Figure 5:
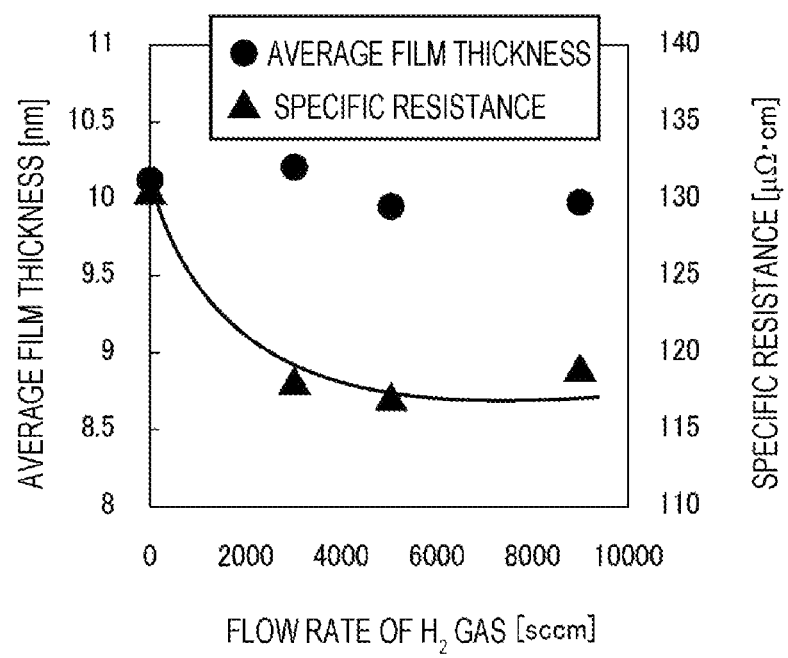
FIG. 5 is a view illustrating specific resistance and film thicknesses when forming a TiN film by repeating steps S1 to S4 for 230 cycles while changing a flow rate of $H_2$ gas when performing a purge process after $NH_3$ gas flows in step S4 in an experiment according to the first exemplary embodiment.

FIG. 5 is a view illustrating specific resistance and film thicknesses when forming a TiN film by repeating steps S1 to S4 for 230 cycles while changing the flow rate of the $H_2$ gas when performing the purge process after the $NH_3$ gas flows in step S4. As illustrated in FIG. 5, it can be seen that specific resistance is decreased when the flow rate of the $H_2$ gas is 2,000 sccm or more.

Next, recipe time, throughput, and specific resistance are obtained through an experiment with various sequences. Here, the $N_2$ gases, which are the carrier gases for the $TiCl_4$ gas and the $NH_3$ gas, are continuously supplied at a flow rate of 500 sccm, respectively, the flow rate of the $TiCl_4$ gas in step S1 is 150 sccm, the flow rate of the $N_2$ gas, which is the purge gas in steps S2 and S4, is 9,000 sccm, the flow rate of the $NH_3$ gas in step S3 is 3,800 sccm, the flow rate of the $H_2$ gas in step S4 is 7,000 sccm, and the standard times in steps S1, S2, S3, and S4 are 0.1 sec, 0.2 sec, 0.25 sec, and 0.3 sec, respectively. Further, the experiments are performed in a case (Sequence 1) in which steps S1 to S4 are repeated in 230 cycles without adding the $H_2$ gas, in a case (Sequence 2) in which steps S1 to S4 are repeated in 230 cycles by adding the $H_2$ gas in step S4, in a case (Sequence 3) in which steps S1 to S4 are repeated in 229 cycles by adding the $H_2$ gas in step S4 and the time in step S4 only for the final cycle is 15 sec, in a case (Sequence 4) in which steps S1 to S4 are repeated in 229 cycles by adding the $H_2$ gas in step S4 and the time in step S4 only for the final cycle is 60 sec, and in a case (Sequence 5) in which steps S1 to S4 are repeated in 46 cycles by adding the $H_2$ gas in step S4, the time in step S4 for the 47th cycle is 15 sec, and the 47th cycle is repeated five times. The results are illustrated in FIG. 6.

FIG. 6 illustrates the recipe time, the throughput (wafer/h), the specific resistance ($\mu\Omega\cdot cm$), and the number of sheets of throughput deterioration for each sequence. As illustrated in FIG. 6, it has been found that in Sequence 2 in which the $H_2$ gas is added in step S4, specific resistance is decreased from 131 $\mu\Omega\cdot cm$ to 117 $\mu\Omega\cdot cm$ without degrading throughput in comparison with Sequence 1 in which the $H_2$ gas is not added. In addition, it has been found that in Sequences 3 and 4 in which the time in step S4 for the final cycle is prolonged, throughput slightly deteriorates in accordance with the time, and specific resistance is further decreased to 109 $\mu\Omega\cdot cm$ and 104 $\mu\Omega\cdot cm$, respectively. In addition, even in Sequence 5 in which the time in step S4 is periodically prolonged, specific resistance is decreased to 105 $\mu\Omega\cdot cm$, but throughput deteriorates. However, throughput deteriorates in Sequences 3 to 5, but the deterioration is within an acceptable range. In addition, good values of 90% or more are obtained in terms of step coverage.

Second Exemplary Embodiment of Film Forming Method

Next, a second exemplary embodiment of the film forming method will be described.

The film forming method according to the present exemplary embodiment forms a TiN film, which is very thin at 2 nm or less, particularly, 1 nm or less and has high continuity as well as high coatability, with a fine pattern by a low-temperature film forming process which is applied to logic or the like.

First, similar to the first exemplary embodiment, in a state in which the valves V1 to V9 are closed and the placement table 21 is moved downward to the delivery position, the gate valve 13 is opened, the wafer W is loaded into the processing container 11 through the loading-unloading port 12 from the vacuum transport chamber (not illustrated) by the transport device (not illustrated), the wafer W is placed on the lift pins 20, the transport device is retracted, and then the gate valve 13 is closed. Further, the placement table 21 is moved upward to the processing position such that the wafer W is placed on the placement table 21. In the present exemplary embodiment, the placement table 21 is heated by the heater 22 to a temperature ranging from 400 to 500° C. Further, the valves V3, V7, and V9 are opened to supply the carrier $N_2$ gas into the processing container 11 through the first to third carrier gas lines 51, 71, and 91 from the first to third carrier gas supply sources 53, 73, and 93, the processing container 11 is maintained in a predetermined depressurized state, and the temperature of the wafer W is controlled to a range of 400 to 500° C., for example, a temperature of 450° C. Further, similar to the first exemplary embodiment, the pressure in the gas storage tanks 42 and 62 is increased.

Figure 7:
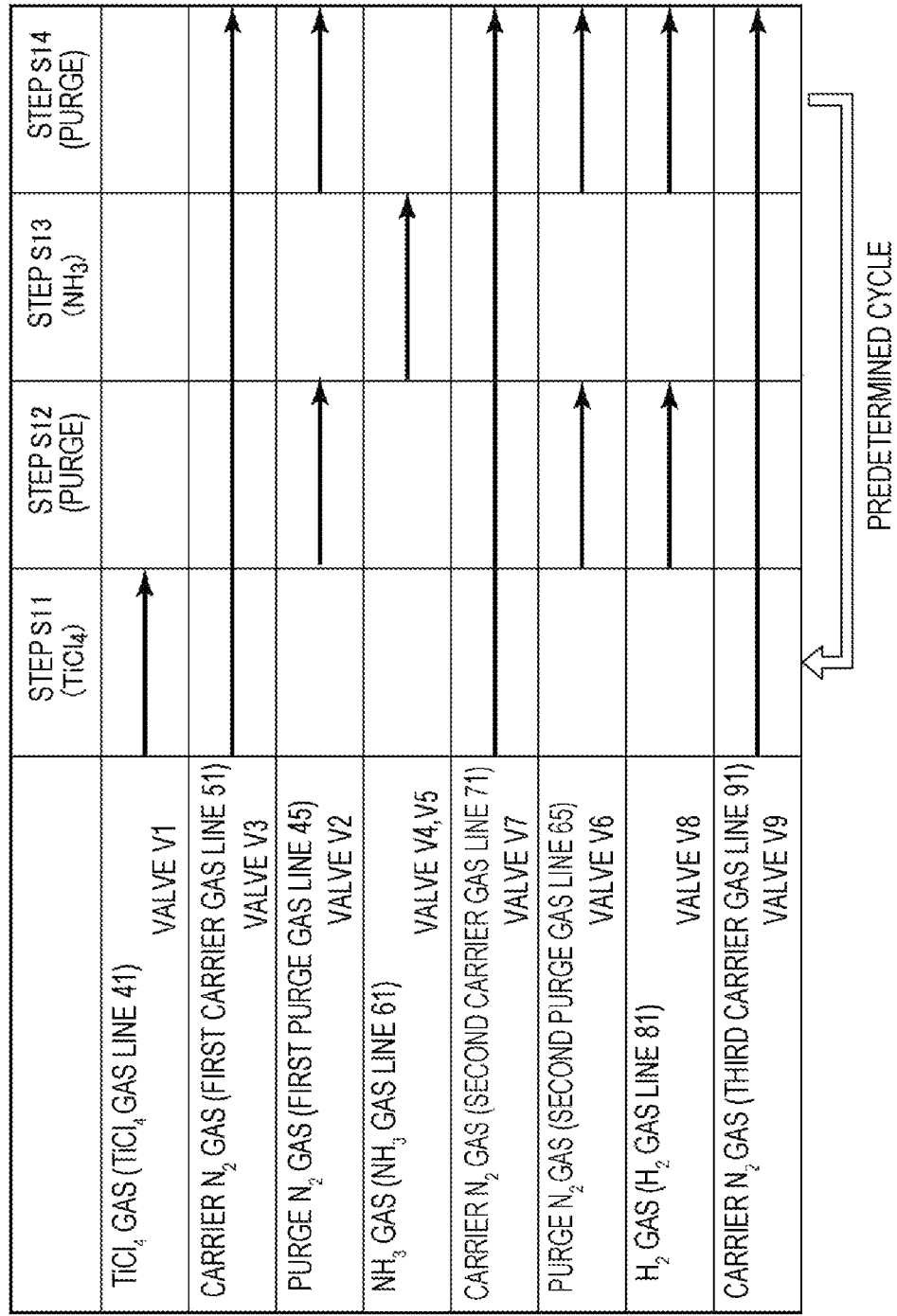
FIG. 7 is a view illustrating an example of a gas supply sequence when performing a film forming method according to a second exemplary embodiment of the present disclosure.
Figure 8:
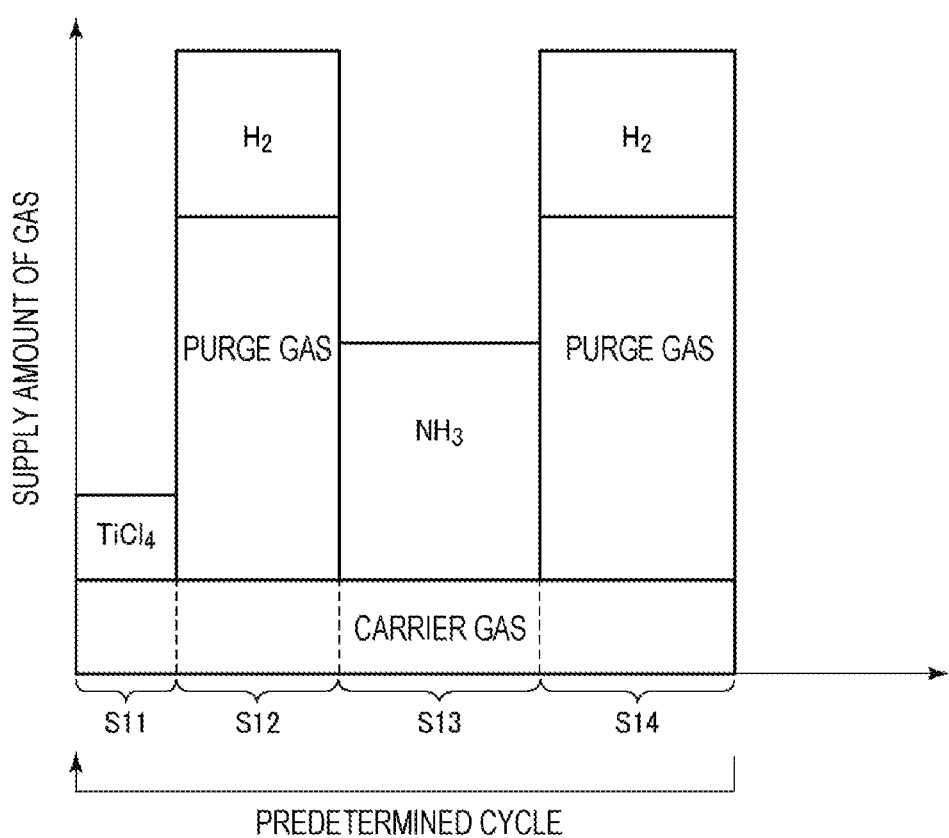
FIG. 8 is a timing chart schematically illustrating a change in amount of gas supplied when performing the film forming method according to the second exemplary embodiment of the present disclosure.

In this state, for example, the TiN film is formed by the ALD as illustrated in the gas supply sequence in FIG. 7 and the timing chart in FIG. 8.

In the present exemplary embodiment, steps S11 to S14 are performed corresponding to steps S1 to S4 in the first exemplary embodiment. Among steps S11 to S14, steps S11, S13, and S14 are performed basically and similarly to steps S1, S3, and S4 in the first exemplary embodiment, but in addition to the purge gas, the $H_2$ gas is supplied in the step of purging the $TiCl_4$ gas in step S12. That is, in the present exemplary embodiment, the $H_2$ gas is supplied in both step S12 which is the process of purging the $TiCl_4$ gas and step S14 which is the process of purging the $NH_3$ gas.

In steps S12 and S14, the flow rate of the $H_2$ gas may be 200 to 30,000 sccm, for example, 7,000 sccm.

The flow rates of the $TiCl_4$ gas, the $NH_3$ gas, the carrier gas, and the purge gas are equal to those in the first exemplary embodiment, and the time in steps S11 to S14 is also equal to the time in steps S1 to S4 in the first exemplary embodiment.

The aforementioned steps S11 to S14 are performed by one or more predetermined cycles, and as a result, it is possible to obtain the reformed TiN film having a predetermined film thickness.

The TiN film used for logic is required to be formed to be very thin at 2 nm or less, particularly, 1 nm or less and to have high continuity as well as high coatability by the low-temperature film forming process. However, in a case in which the TiN film is formed using the $TiCl_4$ gas as a film forming material, electrical repulsion occurs between $TiCl_4$ such that $TiCl_4$ is not adsorbed to a portion of the substrate to which the $TiCl_4$ is to be basically adsorbed, and as a result, it is difficult to increase continuity of the film. In contrast, $TiCl_4$ is reduced by adding the $H_2$ gas in accordance with reactions related to the following Expressions 1 and 2 such that $TiCl_4$ becomes $(TiCl3)^+$ which is an univalent ion or $(TiCl2)^{++}$ which is a divalent ion.

$$2TiCl_4 + H_2 \rightarrow 2(TiCl3)^+ + 2HCl \quad (1)$$

$$TiCl_4 + H_2 \rightarrow (TiCl2)^{++} + 2HCl \quad (2)$$

Because (TiCl3)$^+$ and (TiCl2)$^{++}$ are activated by being ionized, attachment force of (TiCl3)$^+$ and (TiCl2)$^{++}$ to the substrate is increased in comparison with adsorption force of TiCl$_4$, and the TiN film having high continuity may be obtained.

Even in the present exemplary embodiment, the first and second purge gas lines 45 and 65 are provided separately from the first and second carrier gas lines 51 and 71 in order to supply the carrier gases for the TiCl$_4$ gas and the NH$_3$ gas, and the valves V2 and V6 and the flow rate adjusting units 47 and 67 are provided in the first and second purge gas lines 45 and 65 separately from the valves V3 and V7 and the flow rate adjusting units 52 and 72 in the first and second carrier gas lines 51 and 71, and as a result, it is possible to increase the flow rate of the purge gas only during the purge process such that the flow rate of the carrier gas need not be increased. For this reason, coatability (step coverage) may be increased without greatly increasing the flow rate of the TiCl$_4$ gas which is the source gas, and as a result, it is possible to obtain good coatability (step coverage) of 90% or more without degrading productivity. In addition, the processing by the H$_2$ gas, which is performed to increase continuity of the film, is performed during the purge process after the TiCl$_4$ gas is supplied and after the NH$_3$ gas is supplied, and as a result, the ALD is not affected, and deterioration in productivity (throughput) caused by the processing by the H$_2$ gas hardly occurs. In addition, the purge gas and the H$_2$ gas may be supplied during the purge process in a state in which the amount of carrier gas is small, and as a result, it is possible to perform the reforming process by H$_2$ through the purge process in a short time by supplying the H$_2$ gas at a high flow rate.

Of course, even in the present exemplary embodiment, the purge gas is supplied from the gas storage tanks 46 and 66 with increased pressure such that the purge gas is supplied at a high flow rate, for example, a flow rate higher than a flow rate of the carrier gas into the processing container 11 (processing space 10), and as a result, it is possible to purge the TiCl$_4$ gas or the NH$_3$ gas in the processing container 11 in a short time. For this reason, it is possible to further increase throughput.

In this example, the H$_2$ gas is supplied both during the purge process after the TiCl$_4$ gas is supplied and during the purge process after the NH$_3$ gas is supplied, but in the present exemplary embodiment, the H$_2$ gas may be supplied only during the purge process after the TiCl$_4$ gas is supplied.

Next, an experimental result of the present exemplary embodiment will be described.

Initially, a basic experiment for ascertaining an effect obtained by supplying the H$_2$ gas is performed. Here, the effect of the H$_2$ gas is ascertained by continuously supplying H$_2$ when forming the TiN film by the ALD using the TiCl$_4$ gas and the NH$_3$ gas by setting a film forming temperature to 460° C. and using N$_2$ gas, which is the carrier gas continuously supplied, as the purge gas. Further, here, the time taken to supply the TiCl$_4$ gas is 0.05 sec, the time taken to purge the TiCl$_4$ gas is 0.2 sec, the time taken to supply the NH$_3$ gas is 0.3 sec, and the time taken to purge the NH$_3$ gas is 0.3 sec.

Figure 9:
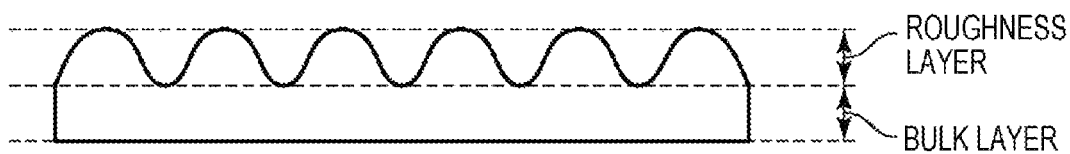
FIG. 9 is a view for explaining a rough ratio.

The continuity of the film is ascertained using a rough ratio. The rough ratio refers to a ratio of a film thickness of a roughness layer having low density to an overall film thickness (roughness layer+bulk layer) when film thicknesses of the two layers including the bulk layer and the roughness layer having different density as illustrated in FIG. 9 are measured by spectral ellipsometry.

Figure 10:
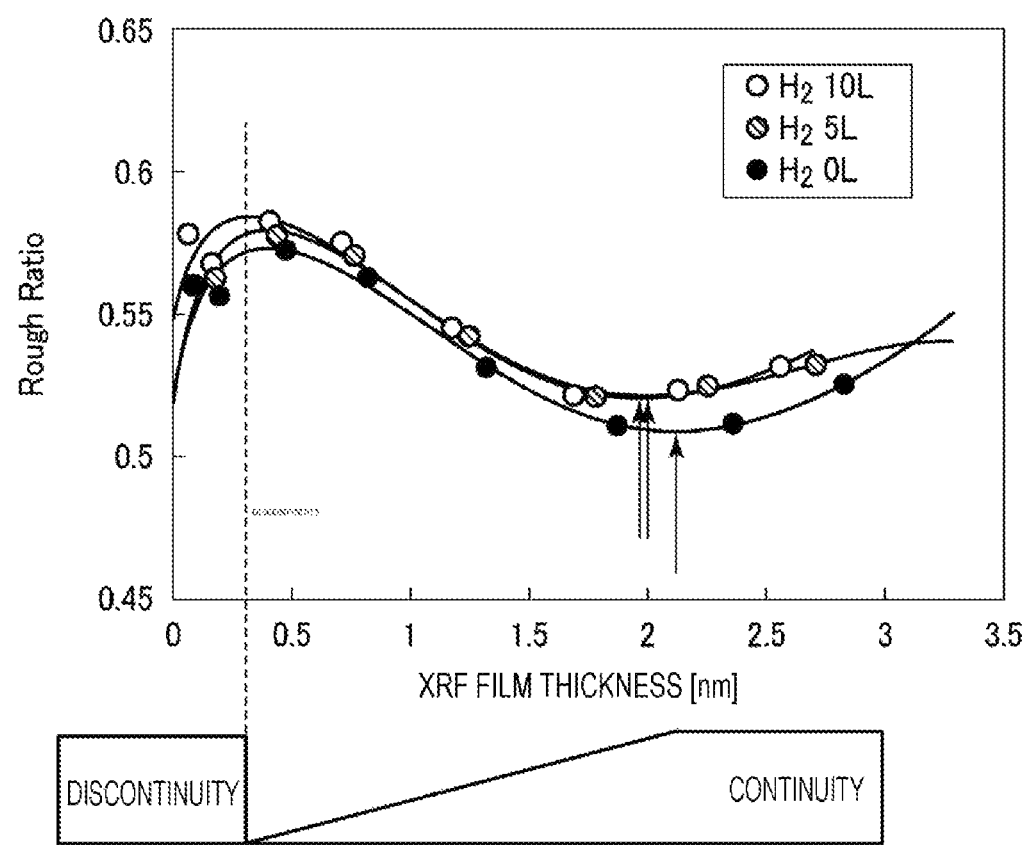
FIG. 10 is a view illustrating a relationship between an XRF film thickness and the rough ratio when changing the flow rate of $H_2$ gas in a basic experiment for verifying an effect obtained by supplying the $H_2$ gas according to the second exemplary embodiment.
Figure 11:
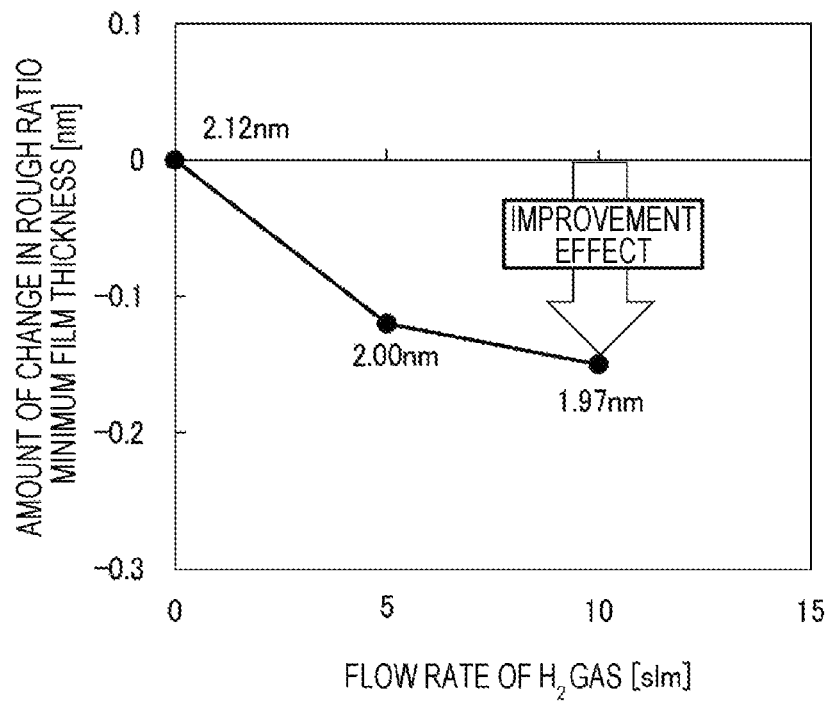
FIG. 11 is a view illustrating a relationship between a flow rate of $H_2$ gas and a rough ratio minimum film thickness in the basic experiment for verifying the effect obtained by supplying the $H_2$ gas according to the second exemplary embodiment.

A result of obtaining a rough ratio minimum film thickness by changing the flow rate of the H$_2$ gas is illustrated in FIGS. 10 and 11. FIG. 10 is a view illustrating a relationship between an XRF film thickness and a rough ratio, in which a horizontal axis is the XRF film thickness and a vertical axis is the rough ratio. The rough ratio is increased from 0 at a point in time at which nucleation begins, the rough ratio becomes a maximum value, and the continuity of the film is increased at a portion where the rough ratio is gradually decreased from the maximum value. The rough ratio minimum film thickness, which is a film thickness of which the rough ratio becomes a minimum value, is one index indicating a degree of continuity. FIG. 11 is a view illustrating a relationship between the flow rate of the H$_2$ gas and the rough ratio minimum film thickness, in which a vertical axis indicates the amount of change in rough ratio minimum film thickness based on the case in which the H$_2$ gas is not supplied. As illustrated in the drawings, it has been found that the rough ratio minimum film thickness is decreased as the flow rate of the H$_2$ gas is increased, and as a result, the continuity of the film is improved.

Figure 12:
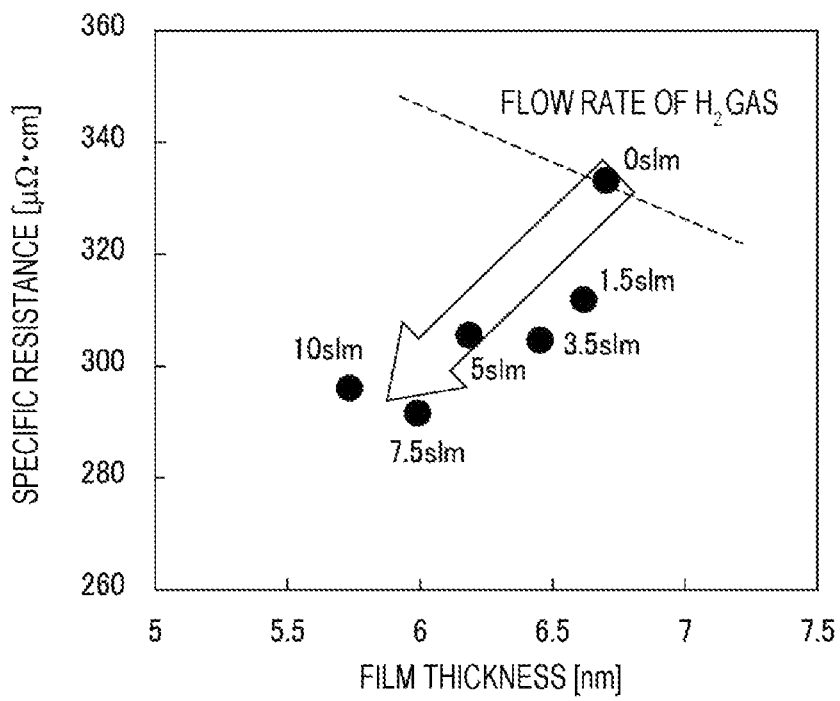
FIG. 12 is a view illustrating a relationship between a film thickness and specific resistance for each flow rate of $H_2$ gas in the basic experiment for verifying the effect obtained by supplying the $H_2$ gas according to the second exemplary embodiment.

FIG. 12 is a view illustrating a relationship between the film thickness and the specific resistance for each H$_2$ flow rate, and it has been found that the specific resistance is also decreased as the supply amount of the H$_2$ gas is increased.

Next, the rough ratio minimum film thickness is obtained at a film forming temperature of 460° C., in a case (Sample 1) in which the N$_2$ gas, which is the carrier gas continuously supplied, is used as the purge gas and the TiN film is formed by the ALD using the TiCl$_4$ gas and the NH$_3$ gas without adding the H$_2$ gas, in a case (Sample 2) in which the N$_2$ gas, which is the purge gas, is supplied during the purge process in addition to the N$_2$ gas which is the carrier gas continuously supplied and the TiN film is formed by the ALD using the TiCl$_4$ gas and the NH$_3$ gas without adding the H$_2$ gas, and in a case (Sample 3) in which the N$_2$ gas, which is the purge gas, is supplied during the purge process in addition to the N$_2$ gas which is the carrier gas continuously supplied and the TiN film is formed by the ALD using the TiCl$_4$ gas and the NH$_3$ gas by supplying the H$_2$ gas during the purge process. Further, here, the time taken to supply the TiCl$_4$ gas is 0.05 sec, the time taken to purge the TiCl$_4$ gas is 0.2 sec, the time taken to supply the NH$_3$ gas is 0.3 sec, and the time taken to purge the NH$_3$ gas is 0.3 sec.

In Sample 1, the flow rate of the TiCl$_4$ gas is 50 sccm, the flow rate of the NH$_3$ gas is 2,700 sccm, and the flow rate of the N$_2$ gas, which is the carrier gas, is 3000 sccm. In Sample 2, the flow rate of the TiCl$_4$ gas is 140 sccm, the flow rate of the NH$_3$ gas is 7,000 sccm, the flow rate of the N$_2$ gas, which is the carrier gas, is 3,000 sccm, and the flow rate of the N$_2$ gas, which is the purge gas, is 9,000 sccm. Sample 3 is identical to Sample 2 except that the flow rate of the H$_2$ gas is 10,000 sccm.

Figure 13:
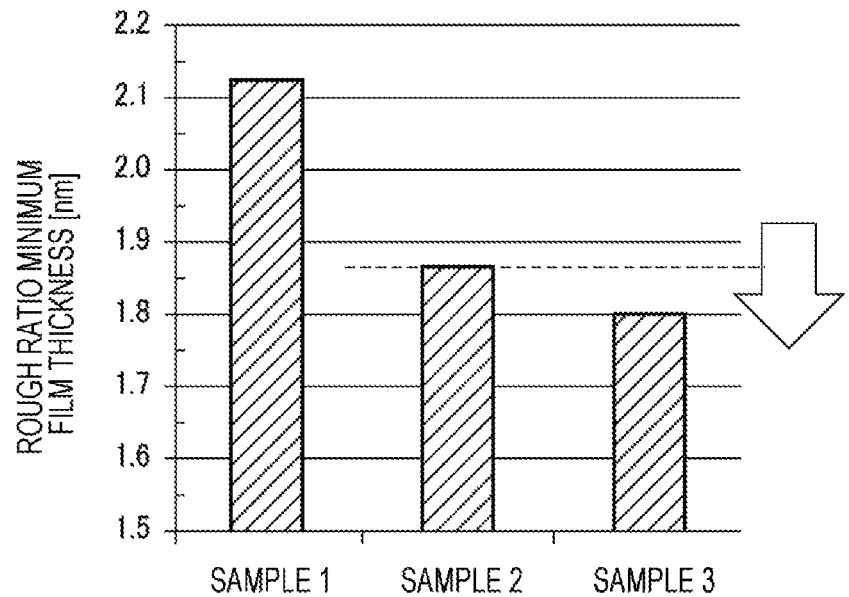
FIG. 13 is a view for explaining an effect of the second exemplary embodiment.

The result is illustrated in FIG. 13. In Sample 1 in which the carrier gas is used as the purge gas and the H$_2$ gas is not added and in Sample 2 in which the purge gas is used separately from the carrier gas and the H$_2$ gas is not added, the rough ratio minimum film thicknesses are 2.13 nm and 1.88 nm, respectively, but in Sample 3 in which the H$_2$ gas is added during the purge process, the rough ratio minimum film thickness is further decreased to 1.8 nm. Therefore, it has been found that in the present exemplary embodiment, the continuity of the film is improved.

Third Exemplary Embodiment

Next, a third exemplary embodiment of the film forming method will be described.

The film forming method according to the present exemplary embodiment inhibits the TiN film itself from being etched by the TiCl$_4$ gas by adding the H$_2$ gas, thereby ensuring film thickness uniformity.

For example, in some instances, the TiN film needs to be formed at a high temperature of about 700° C. in order to obtain the TiN film having low specific resistance, but at this high temperature, the flow rate of the TiCl$_4$ gas, which is a Ti material, needs to be a comparatively high flow rate of 50 to 270 sccm, for example, 270 sccm in order to obtain high step coverage.

However, if the TiCl$_4$ gas is supplied at a high flow rate, a film thickness at a central portion of the TiN film is decreased, and as a result, in-plane uniformity of the film thickness deteriorates. As a result of analyzing the reason, it is determined that the reason is that because the TiCl$_4$ gas is a gas having a high etching property, the formed TiN film itself is etched by the TiCl$_4$ gas as the TiCl$_4$ gas is supplied at a high flow rate as described above such that an etching effect thereof is increased at the central portion of the wafer W.

Figure 14:
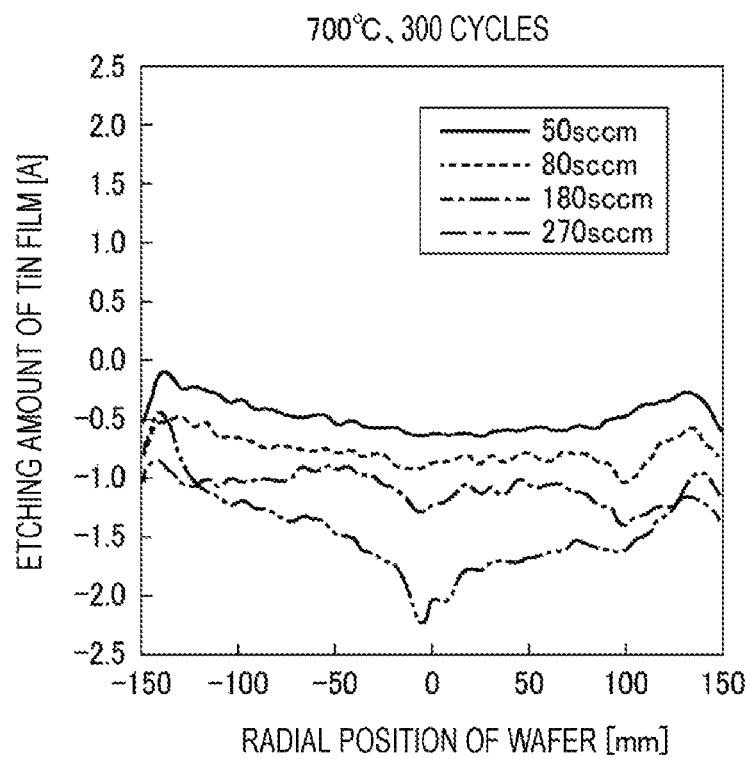
FIG. 14 is a view illustrating a relationship between a radial position of a wafer and an etching amount for a TiN film for each flow rate when changing the flow rate of $TiCl_4$ at a temperature of 700° C. in an etching test for the TiN film using $TiCl_4$ gas.

Actually, the TiN film is formed using the apparatus illustrated in FIG. 1 under a condition in which the temperature is 700° C., the pressure is 5 Torr (666 Pa), the flow rate of the TiCl$_4$ gas is 50 sccm, and the flow rate of the NH$_3$ gas is 3,500 sccm, and then the TiN film is etched by changing the flow rate of the TiCl$_4$ gas to 50 sccm, 80 sccm, 180 sccm, and 270 sccm at 700° C., and repeating 300 times a cycle in which the time taken to supply the TiCl$_4$ gas is 0.05 sec and the time taken to perform the purge process (the flow rate of the N$_2$ gas is 7,000 sccm for each line) is 0.8 sec. The result is illustrated in FIG. 14. FIG. 14 is a view illustrating a relationship between a radial position of the wafer and an etching amount of the TiN film for each flow rate of TiCl$_4$. As illustrated in FIG. 14, it has been found that as the flow rate of the TiCl$_4$ gas is increased, the etching amount is increased, and the central portion is greatly etched. From this result, it is conceived that the deterioration in in-plane uniformity of the film thickness when the flow rate of the TiCl$_4$ gas is a high flow rate results from the etching of the TiCl$_4$ gas.

Figure 15:
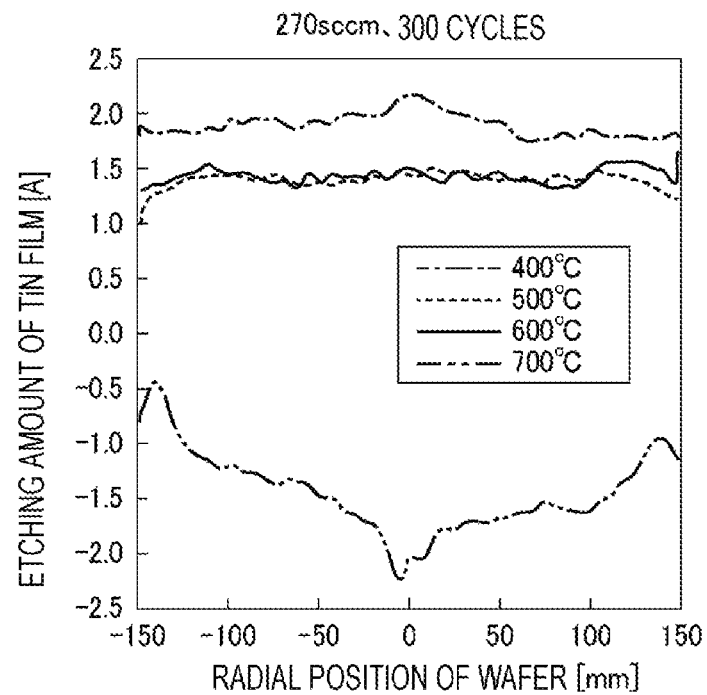
FIG. 15 is a view illustrating a relationship between a radial position of a wafer and an etching amount for a TiN film for each temperature when changing the temperature to 400° C., 500° C., and 600° C. at a $TiCl_4$ gas flow rate of 270 sccm in the etching test for the TiN film using $TiCl_4$ gas.

Next, after the TiN film is formed under the same condition, the flow rate of the TiCl$_4$ gas during the etching process is fixed to 270 sccm, the temperature is changed to 400° C., 500° C., 600° C., and 700° C., the identical etching process is performed for 300 cycles, and then the etching amount is ascertained. FIG. 15 is a view illustrating a relationship between the radial position of the wafer and the etching amount of the TiN film in this case. Referring to FIG. 15, it has been found that the etching is significantly performed at 700° C., but until a temperature of 600° C., the etching is not performed, and the film is rather increased.

Figure 16:
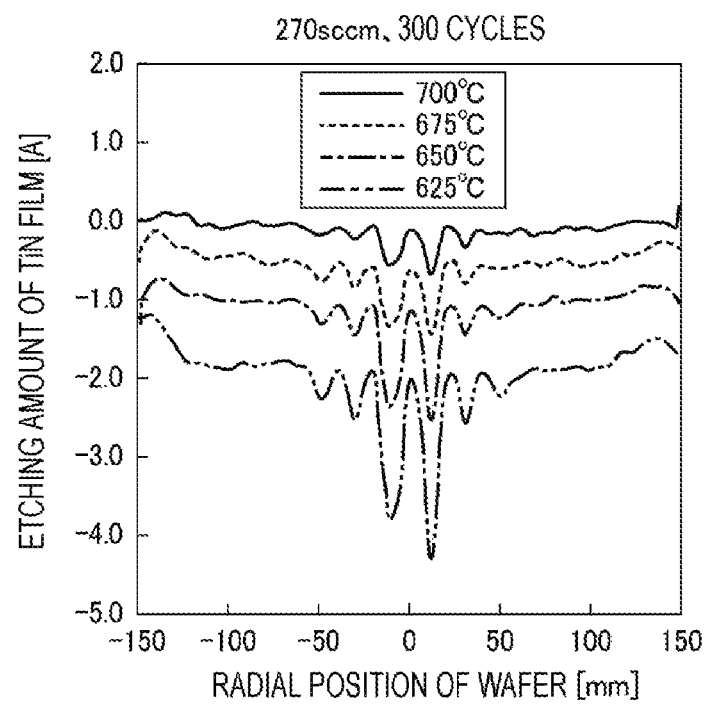
FIG. 16 is a view illustrating a relationship between a radial position of a wafer and an etching amount for a TiN film for each temperature when changing the temperature to 625° C., 650° C., 675° C., and 700° C. at a $TiCl_4$ gas flow rate of 270 sccm in the etching test for the TiN film using $TiCl_4$ gas.

Next, after the TiN film is formed under the same condition except for partially changing a configuration of the apparatus, the flow rate of the TiCl$_4$ gas during the etching process is fixed to 270 sccm, the temperature is changed to 625° C., 650° C., 675° C., and 700° C., the identical etching process is performed for 300 cycles, and then the etching amount is ascertained. FIG. 16 is a view illustrating a relationship between the radial position of the wafer and the etching amount of the TiN film in this case. Referring to FIG. 16, it can be seen that an influence of the etching by the TiCl$_4$ gas occurs from a temperature of 625° C. and is increased as the temperature is increased.

Figure 17:
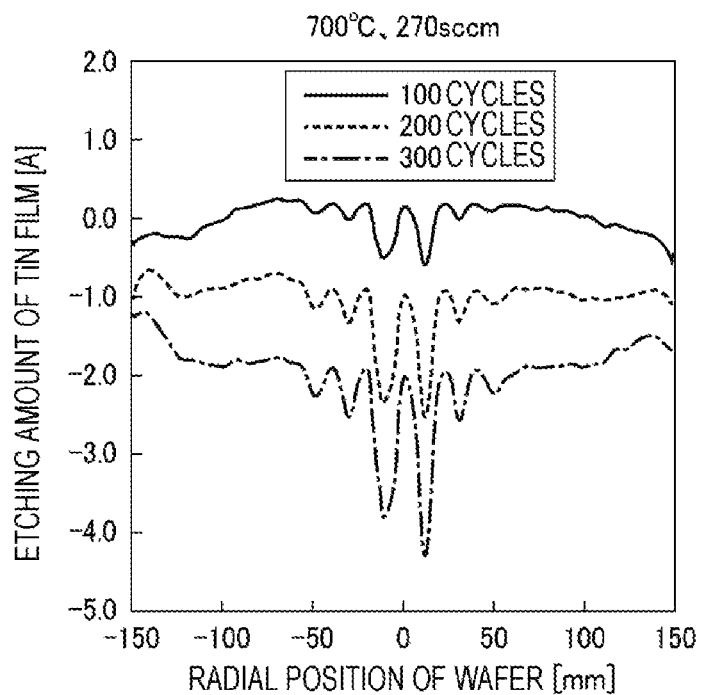
FIG. 17 is a view illustrating a relationship between a radial position of a wafer and an etching amount for a TiN film for each cycle when changing an etching cycle to 100 cycles, 200 cycles, and 300 cycles at a temperature of 700° C. and a $TiCl_4$ gas flow rate of 270 sccm in the etching test for the TiN film using $TiCl_4$ gas.

Next, the etching amount is ascertained using the apparatus identical to the apparatus illustrated in FIG. 16 by forming the TiN film under the same condition, setting the temperature to 700° C. and the flow rate of the TiCl$_4$ gas to 270 sccm, and changing the aforementioned etching cycles to 100 cycles, 200 cycles, and 300 cycles. FIG. 17 is a view illustrating a relationship between the radial position of the wafer and the etching amount of the TiN film in this case. Referring to FIG. 17, it can be seen that the influence of the etching of the TiCl$_4$ gas is small when the number of cycles is small, while the influence is increased as the number of cycles is increased.

In the present exemplary embodiment, the etching action caused by an increase in flow rate of the TiCl$_4$ gas is inhibited by adding the H$_2$ gas.

An experimental result for ascertaining the result will be described.

Figure 18:
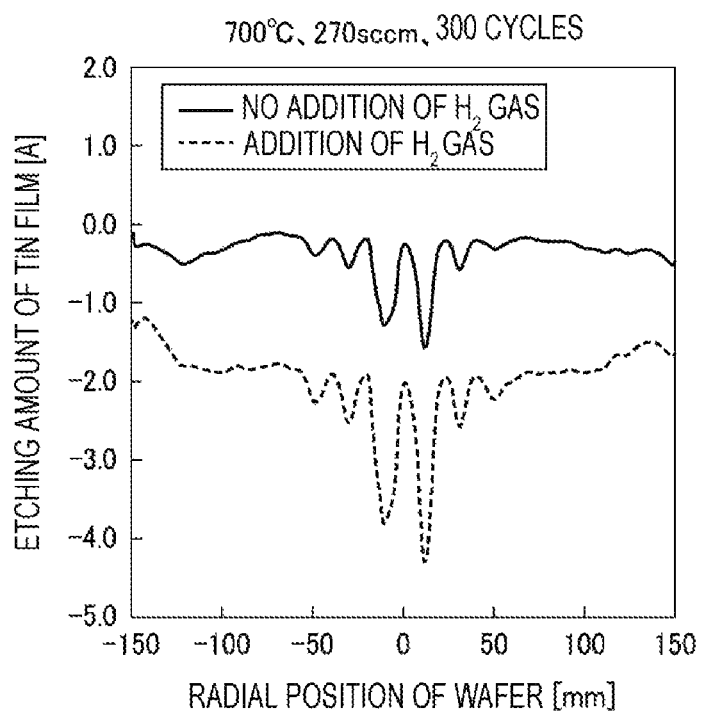
FIG. 18 is a view illustrating a relationship between a radial position and an etching amount for a TiN film when $H_2$ gas is not added and a relationship between a radial position and an etching amount when $H_2$ gas is added, during the etching test, at a temperature of 700° C. and a $TiCl_4$ gas flow rate of 270 sccm in the etching test for the TiN film using $TiCl_4$ gas.

Here, the etching amount is ascertained after the TiN film is formed under the same condition using the apparatus which is the same as the apparatus illustrated in FIG. 16, in a case in which the TiN film is etched (without adding H$_2$ when forming the TiN film) by repeating 300 times a cycle in which the temperature is 700° C., the flow rate of the TiCl$_4$ gas is 270 sccm, the time taken to supply the TiCl$_4$ gas is 0.05 sec, and the time taken to perform the purge process (the flow rate of the N$_2$ gas is 7,000 sccm for each line) is 0.8 sec, and in a case in which the TiN film, which is formed under the same condition except that the H$_2$ gas (flow rate: 7000 sccm) is further added in addition to the N$_2$ gas (flow rate: 7,000 sccm for each line) during the purge process, is etched (by adding H$_2$ when forming the TiN film) by repeating 300 times a cycle in which the temperature is 700° C., the flow rate of the TiCl$_4$ gas is 270 sccm, the time taken to supply the TiCl$_4$ gas is 0.05 sec, and the time taken to perform the purge process (the flow rate of the N$_2$ gas is 7,000 sccm for each line) is 0.85 sec. FIG. 18 is a view illustrating a relationship between the radial position of the wafer and the etching amount of the TiN film in this case. Referring to FIG. 18, it has been found that the etching of the TiN film may be inhibited by adding the H$_2$ gas when forming the TiN film.

Based on the experimental results, in the present exemplary embodiment, the TiN film is formed by adding the H$_2$ gas in the sequence identical to the sequence in the first exemplary embodiment or the second exemplary embodiment under the condition in which the temperature is 625° C. or higher and the flow rate of the TiCl$_4$ gas is 50 to 270 sccm.

Specifically, first, similar to the first and second exemplary embodiments, in a state in which the valves V1 to V9 are closed and the placement table 21 is moved downward to the delivery position, the gate valve 13 is opened, the wafer W is loaded into the processing container 11 through the loading-unloading port 12 from the vacuum transport chamber (not illustrated) by the transport device (not illustrated), the wafer W is placed on the lift pins 20, the transport device is retracted, and then the gate valve 13 is closed. Further, the placement table 21 is moved upward to the processing position such that the wafer W is placed on the placement table 21. In the present exemplary embodiment, the placement table 21 is heated by the heater 22 to a temperature ranging from 625 to 740° C. Further, the valves V3, V7, and V9 are opened to supply the carrier N$_2$ gas into the processing container 11 through the first to third carrier gas lines 51, 71, and 91 from the first to third carrier gas supply sources 53, 73, and 93, the processing container 11 is maintained in a predetermined depressurized state, and the temperature of the wafer W is controlled to a range of 625 to 740° C., for example, a temperature of 700° C. Further, similar to the first and second exemplary embodiments, the pressure in the gas storage tanks 42 and 62 is increased.

In this state, for example, the TiN film is formed by the ALD as illustrated in the gas supply sequence in FIG. 2 and the timing chart in FIG. 3 in the first exemplary embodiment or in the gas supply sequence in FIG. 7 and the timing chart in FIG. 8 in the second exemplary embodiment. That is, in the present exemplary embodiment, the TiN film having a predetermined film thickness is formed by repeating the supply of the TiCl$_4$ gas, the purge of the TiCl$_4$ gas, the supply of the NH$_3$ gas, and the purge of the NH$_3$ gas, and in this case, the H$_2$ gas may be supplied only in the purge step after the NH$_3$ gas is supplied, or the H$_2$ gas may be supplied in the purge step both after the TiCl$_4$ gas is supplied and after the NH$_3$ gas is supplied.

In this case, the flow rate of the H$_2$ gas may be 200 to 30,000 sccm, for example, 7,000 sccm.

The flow rates of the TiCl$_4$ gas, the NH$_3$ gas, the carrier gas, and the purge gas are equal to those in the first exemplary embodiment and the second exemplary embodiment, and the process time is also equal to that in steps S1 to S4 and steps S11 to S14 in the first exemplary embodiment and the second exemplary embodiment.

In the present exemplary embodiment, with the aforementioned process, the etching action of the TiCl$_4$ gas is inhibited by supplying the H$_2$ gas during the purge process even if the film forming temperature is high and the flow rate of the TiCl$_4$ gas is a high flow rate, and as a result, it is possible to ensure high productivity, obtain the film having high coatability, and obtain the TiN film having a uniform film thickness.

<Other Applications>

For example, in the exemplary embodiment, the case in which the TiN film is formed using the TiCl$_4$ gas as the source gas and using the NH$_3$ gas as the reactant gas has been described, but the Ti source gas and the reactant gas are not limited thereto.

In the exemplary embodiment, the case in which the TiN film is formed by the Ti source gas and the nitride gas as the reactant gas has been described, but the formed film may be applied to various films such as, for example, a WN film, a W film, a TiON film, an SiN film, an SiO$_2$ film without being particularly limited as long as the film is formed by the source gas and the reactant gas.

In the present exemplary embodiment, the example in which the N$_2$ gas is used as an inert gas used as the carrier gas or the purge gas has been described, but the inert gas is not limited to the N$_2$ gas, and other inert gases such as rare gases including Ar gas or He gas may be used.

In the exemplary embodiment, an example in which the H$_2$ gas is used as the additive gas having a function of decreasing specific resistance to the TiN film and a function of improving continuity of the film has been described, but the additive gas is not limited thereto, and an additive gas which provides a predetermined function to the film may be used, and various gases such as O$_2$ gas, NH$_3$ gas, BCl$_3$ gas, SiH$_4$ gas, and SiH$_2$Cl$_2$ gas may be used without being limited to the H$_2$ gas.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A film forming method for forming a predetermined film, the film forming method comprising:
   providing a film forming apparatus including:
   a processing container configured to accommodate therein a substrate to be processed;
   a gas supply configured to supply a source gas and a reactant gas for forming the predetermined film on the substrate to be processed, carrier gases for carrying the source gas and the reactant gas to the processing container and a purge gas for purging an interior of the processing container, respectively; and
   a gas discharge configured to discharge gases in the processing container and maintain a vacuum atmosphere in the processing container,
   wherein the gas supply includes a source gas flow path configured to supply the source gas into the processing container, a reactant gas flow path configured to supply the reactant gas into the processing container, a first carrier gas flow path and a second carrier gas flow path connected to the source gas flow path and the reactant gas flow path, respectively, and configured to supply the carrier gases for the source gas and the reactant gas, a purge gas flow path including a first purge gas flow path connected to the first carrier gas flow path and a second purge gas flow path connected to the second carrier gas flow path, and
   wherein the purge gas flow path is configured to supply the purge gas for purging the interior of the processing container into the processing container by controlling a flow rate of the purge gas separately from the first carrier gas and the second carrier gas, an additive gas flow path configured to supply an additive gas having a predetermined function to the predetermined film, and opening/closing valves configured to independently open and close the source gas flow path, the reactant gas flow path, the first and second carrier gas flow paths, the purge gas flow path, and the additive gas flow path, respectively;
   a first process of constantly supplying the carrier gases into the processing container through the first carrier gas flow path and the second carrier gas flow path in a state in which the substrate to be processed is disposed in the processing container;
   a second process of causing the source gas to be adsorbed to a surface of the substrate to be processed by supplying the source gas into the processing container through the source gas flow path;
   a third process of purging the source gas by stopping the supply of the source gas and supplying the purge gas into the processing container through the purge gas flow path;
   a fourth process of causing the source gas and the reactant gas to react with each other by supplying the reactant gas into the processing container through the reactant gas flow path; and,
   a fifth process of purging the reactant gas by stopping the supply of the reactant gas and supplying the purge gas into the processing container through the purge gas flow path,
   wherein the purge gas is supplied into the processing container through the first and second purge gas flow paths at a flow rate which is higher than the flow rate of the first carrier gas and the second carrier gas, while not increasing the flow rate of the first and second carrier gases, wherein the second to fifth processes are performed in a predetermined cycle, and wherein the additive gas having the predetermined function is supplied through the additive gas flow path as at least a part of the purge gas in one or both of the third process of purging the source gas and the fifth process of purging the reactant gas.

2. The film forming method according to claim 1, wherein the purge gas flow path has a gas storage configured to store the purge gas therein, and the purge gas is stored in the gas storage and then supplied into the processing container when pressure in the gas storage is increased and the valve provided in the purge gas flow path is opened.

3. The film forming method according to claim 1, wherein the first purge gas flow path is further connected to the source gas flow path and the second purge gas flow path is further connected to the reactant gas flow path, and supplies the purge gas through the first purge gas flow path and the second purge gas flow path in the third process of purging the source gas and the fifth process of purging the reactant gas.

4. The film forming method according to claim 1, wherein the source gas is $TiCl_4$ gas, the reactant gas is $NH_3$ gas, and the predetermined film is a TiN film.

5. The film forming method according to claim 4, wherein the additive gas is $H_2$ gas.

6. The film forming method according to claim 5, wherein a temperature during film forming is 400 to 750° C., $H_2$ gas is supplied as the additive gas in the fifth process of purging the reactant gas, and the $H_2$ gas serves to decrease specific resistance of the TiN film.

7. The film forming method according to claim 6, wherein the second and fifth processes are repeated in multiple cycles, and time of the fifth process for a final cycle is prolonged and wherein the time is 60 seconds or less.

8. The film forming method according to claim 6, wherein the second and fifth processes are repeated in multiple cycles, and the fifth process is periodically prolonged.

9. The film forming method according to claim 5, wherein a temperature during film forming is 400 to 500° C., $H_2$ gas is supplied as the additive gas in both of the third process of purging the source gas and the fifth process of purging the reactant gas, and the $H_2$ gas serves to improve continuity of the TiN film.

10. The film forming method according to claim 5, wherein $H_2$ gas is supplied as the additive gas only in the fifth process of purging the reactant gas or in both of the third process of purging the source gas and the fifth process of purging the reactant gas, and the $H_2$ gas serves to inhibit an etching action of $TiCl_4$.

11. The film forming method according to claim 10, wherein a temperature during film forming is within a range of 625 to 740° C.

12. The film forming method according to claim 10, wherein a flow rate of the $TiCl_4$ gas is within a range of 50 to 270 sccm.

13. The film forming method according to claim 11, wherein a flow rate of the $TiCl_4$ gas is within a range of 50 to 270 sccm.

* * * * *